(12) United States Patent
Nakahara

(10) Patent No.: US 9,762,053 B2
(45) Date of Patent: *Sep. 12, 2017

(54) LOAD DRIVING DEVICE

(71) Applicant: Renesas Electronics Corporation, Kawasaki (JP)

(72) Inventor: Akihiro Nakahara, Kanagawa (JP)

(73) Assignee: RENESAS ELECTRONICS CORPORATION, Kawasaki, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/465,160

(22) Filed: Aug. 21, 2014

(65) Prior Publication Data

US 2014/0362484 A1    Dec. 11, 2014

Related U.S. Application Data

(63) Continuation of application No. 12/905,390, filed on Oct. 15, 2010, now Pat. No. 8,848,328.

(30) Foreign Application Priority Data

Nov. 5, 2009    (JP) .................. 2009-254361

(51) Int. Cl.
*H02H 3/00* (2006.01)
*H02H 11/00* (2006.01)
(Continued)

(52) U.S. Cl.
CPC ......... *H02H 11/003* (2013.01); *H03K 17/063* (2013.01); *H03K 17/08122* (2013.01);
(Continued)

(58) Field of Classification Search
CPC .......... H03K 17/08122; H03K 17/063; H03K 17/0822; H02H 11/003; H02H 1/003
(Continued)

(56) References Cited

U.S. PATENT DOCUMENTS 4,890,185 A    12/1989    Karl et al.
4,899,309 A *   2/1990    Kitazawa .............. G11C 16/28
                                                    327/52

(Continued)

FOREIGN PATENT DOCUMENTS

DE    3741394 A1    6/1989
EP    0 426 103 A2    5/1991
(Continued)

OTHER PUBLICATIONS

Chinese Office Action dated Aug. 4, 2014 with an English Translation.

(Continued)

*Primary Examiner* — Thienvu Tran
*Assistant Examiner* — Lucy Thomas
(74) *Attorney, Agent, or Firm* — McGinn IP Law Group, PLLC.

(57) ABSTRACT

A load driving method includes bringing an output transistor disposed between a first power supply line and an output terminal connected to a load into a conduction state by a protection transistor provided between a gate of the output transistor and a second power supply line when a polarity of a power supply coupled between the first power supply line and the second power supply lines is reversed, and forming a conductive path between the second power supply line and a back gate of the protection transistor via a transistor by a back gate control circuit when the polarity of the power supply is normal, the back gate control circuit including the transistor, a gate of the transistor being coupled to the first power supply line directly via a connection node located in a connecting line that couples the first power supply line and the output transistor, the transistor being coupled between the second power supply line and the back gate of the protection transistor.

17 Claims, 14 Drawing Sheets

(51) Int. Cl.
*H03K 17/06* (2006.01)
*H03K 17/0812* (2006.01)

(52) U.S. Cl.
CPC ............... *H03K 2217/0018* (2013.01); *H03K 2217/0036* (2013.01)

(58) Field of Classification Search
USPC .............................................. 361/84, 88, 18
See application file for complete search history.

(56) References Cited

U.S. PATENT DOCUMENTS

| | | | |
|---|---|---|---|
| 5,166,852 | A | 11/1992 | Sano |
| 6,034,448 | A | 3/2000 | Xu et al. |
| 6,882,513 | B2 | 4/2005 | Laraia |
| 7,129,759 | B2 | 10/2006 | Fukami |
| 7,283,343 | B2 | 10/2007 | Grose et al. |
| 7,508,255 | B2 | 3/2009 | Furuichi et al. |
| 8,031,450 | B2 | 10/2011 | Nakahara |
| 8,054,106 | B2 | 11/2011 | Nakahara |
| 8,116,051 | B2 | 2/2012 | Nakahara |
| 8,174,808 | B2 | 5/2012 | Nakahara |
| 8,270,133 | B2 | 9/2012 | Nakahara |
| 8,351,172 | B2 | 1/2013 | Nakahara |
| 2007/0170978 | A1 | 7/2007 | Furuichi et al. |
| 2009/0146628 | A1 | 6/2009 | Nakahara |
| 2009/0147422 | A1 | 6/2009 | Nakahara |
| 2009/0153225 | A1 | 6/2009 | Nakahara |
| 2009/0154041 | A1 | 6/2009 | Nakahara |
| 2011/0102956 | A1 | 5/2011 | Nakahara |
| 2012/0032707 | A1 | 2/2012 | Nakahara |
| 2012/0188674 | A1 | 7/2012 | Nakahara |

FOREIGN PATENT DOCUMENTS

| | | |
|---|---|---|
| EP | 2 071 723 A2 | 6/2009 |
| EP | 2 071 724 A1 | 6/2009 |
| EP | 2 071 725 A1 | 6/2009 |
| EP | 2 071 726 A2 | 6/2009 |
| JP | 2009-165113 A | 7/2009 |
| JP | 2009-165114 A | 7/2009 |

OTHER PUBLICATIONS

Chinese Office Action dated Aug. 18, 2014 with an English Translation.
Chinese Office Action dated Mar. 3, 2014 with an English translation.
Chinese Office Action dated Jan. 24, 2014 with English language translation thereof.
Japanese Office Action dated Oct. 8, 2013 with English translation thereof.
Notice of Allowance dated Sep. 6, 2013 in U.S. Appl. No. 12/905,401.
Office Action dated Jul. 2, 2013 in U.S. Appl. No. 12/905,401.
European Office Action dated Apr. 5, 2013 in Application No. 10 014 295.9.
Office Action dated Feb. 28, 2013 in U.S. Appl. No. 12/905,401.
U.S. Notice of Allowance dated May 10, 2012, for U.S. Appl. No. 12/905,414.
European Search Report dated Mar. 22, 2012.
European Search Report dated Mar. 20, 2012.
European Search Report dated Feb. 24, 2011.
European Search Report dated Feb. 18, 2011.
European Search Report dated Feb. 21, 2011.
U.S. Office Action dated Jan. 14, 2014 in co-pending U.S. Appl. No. 12/905,390.
U.S. Office Action dated Feb. 12, 2013 in co-pending U.S. Appl. No. 12/905,390.
U.S. Office Action dated Oct. 10, 2012 in co-pending U.S. Appl. No. 12/905,390.
U.S. Notice of Allowance dated May 12, 2014 in co-pending U.S. Appl. No. 12/905,390.
Chinese Office Action dated Aug. 25, 2014 with English Translation.

* cited by examiner

LOAD DRIVING DEVICE

The present application is a Continuation Application of U.S. patent application Ser. No. 12/905,390, filed on Oct. 15, 2010, which is based on and claims priority from Japanese patent application No. 2009-254361, filed on Nov. 5, 2009, the entire contents of which are incorporated herein by reference.

BACKGROUND

1. Field of the Invention

The present invention relates to a load driving device, and more particularly, to a load driving device including an output transistor that controls power supply to a load.

2. Description of Related Art

Semiconductors for power supply have been widely employed as load driving devices that supply power from a power supply to a load. In one field of application, the semiconductors are used to drive actuators or lamps of vehicles.

In the case of using such a load driving device for vehicles, there is a demand for preventing a wasteful consumption current from occurring when the load driving device is in a standby state, with a standby current on the order of microamperes. In case the power supply is reversely connected by mistake, there is a demand for preventing the load driving device from being destroyed. If the power supply is reversely connected, it is desirable to bring a power device (e.g., an output transistor) into a conduction state, to thereby suppress heat generation in the power device and prevent breakdown of the load driving device.

Japanese Unexamined Patent Application Publication No. 2009-165114 discloses a solution for these demands. FIG. 14 shows a load driving device disclosed in Japanese Unexamined Patent Application Publication No. 2009-165114. An operation of the load driving device when a power supply is normally connected and an operation thereof when the power supply is reversely connected are described with reference to FIG. 14.

When the power supply is normally connected, a positive-polarity-side voltage VB of a power supply 10 is supplied to a power supply terminal PWR. Further, a negative-polarity-side voltage VSS of the power supply 10 is supplied to a ground terminal GND.

When an output transistor T1 is conductive, a transistor MN2 is non-conductive. Specifically, a driver circuit 12 outputs a signal S1 of H level and a signal S2 of L level. At this time, transistors MN6 and MN7 provided in a back gate control circuit 16 are conductive. This is because when the transistor T1 becomes conductive, a potential of an output terminal OUT indicates the H level, and a gate potential of each of the transistors MN6 and MN7 becomes higher than a potential of the ground terminal GND. Further, transistors MN4 and MN5 provided in the back gate control circuit 16 become non-conductive. This is because a gate potential of each of the transistors MN4 and MN5 is equal to the potential of the ground terminal GND.

Thus, the potential of the ground terminal GND is applied to a back gate of a protection transistor MN3 which is provided for reverse connection protection. Then, the protection transistor MN3 becomes non-conductive. As a result, there is no path for discharging the gate charge of the transistor T1, and thus the transistor T1 is made more conductive by the signal S1.

When the output transistor T1 is non-conductive, the transistor MN2 is conductive. Specifically, the driver circuit 12 outputs the signal S1 of L level and the signal S2 of H level. At this time, the transistor MN2 discharges the gate charge of the transistor T1, thereby bringing the transistor T1 into a non-conduction state.

In this case, the transistors MN6 and MN7 provided in the back gate control circuit 16 are conductive while the potential of the output terminal OUT is high. However, when the potential of the output terminal OUT shifts toward the potential of the ground terminal GND, the transistors MN6 and MN7 become non-conductive. Also, the transistors MN4 and MN5 provided in the back gate control circuit 16 become non-conductive. In short, each of the transistors MN4 to MN7 becomes non-conductive. However, since the potential of each of the output terminal OUT and the ground terminal OND is equal to the potential of the ground terminal GND, the back gate of the protection transistor MN3 indicates the potential of the ground terminal GND. Accordingly, the protection transistor MN3 becomes non-conductive.

When the power supply is reversely connected, the positive-polarity-side voltage VB of the power supply 10 is supplied to the ground terminal GND. Further, the negative-polarity-side voltage VSS is supplied to the power supply terminal PWR. When the power supply is reversely connected, the driver circuit 12 and the transistor MN2 cannot operate normally. This is because a parasitic diode between a back gate and a drain of each transistor is forward biased due to the reverse connection of the power supply 10, which makes it impossible for each transistor to operate normally.

The potential of the output terminal OUT first indicates a forward voltage of the parasitic diode of the output transistor T1. When the protection transistor MN3 provided in a reverse connection protection circuit 15 starts supplying electric charges to a gate of the output transistor T1, the transistor T1 becomes conductive. As a result, the potential of the output terminal OUT approaches the potential of the power supply terminal PWR (i.e., a value of voltage drop caused by an on-resistance of the output transistor T1 and a load current). Further, an anode potential of a diode D10 indicates a forward voltage of the diode D10.

A back gate of the transistor MN7, which is provided in the back gate control circuit 16, is not coupled to the GND terminal. Accordingly, the transistor MN7 operates as a reverse-biased diode (backflow prevention diode).

The potential of the output terminal OUT and an anode potential of the diode D10 first indicate a forward voltage (e.g., about 0.6 V) of a diode. Thus, a low potential is applied to the back gate of the protection transistor MN3, and the protection transistor MN3 becomes conductive. As a result, electric charges are supplied to the gate of the transistor T1 from the GND terminal through the protection transistor MN3. Then, a gate voltage of the transistor T1 increases, and the transistor T1 becomes conductive. When the transistor T1 becomes conductive, the potential of the output terminal OUT decreases to about a potential of the power supply terminal PWR (a potential according to the negative-polarity-side voltage VSS) from the forward voltage of the diode. Also in this case, the back gate of the protection transistor MN3 is maintained at a low potential, and thus the protection transistor MN3 maintains the conduction state. Accordingly, the transistor T1 maintains the conduction state. In this manner, the load driving device according to the prior art can suppress heat generation in the transistor T1, thereby preventing breakdown of the load driving device.

SUMMARY

The present inventor has found that a loss may occur under certain conditions in the prior art. Specifically, a loss occurs in which, in the case where the load driving device of the prior art shown in FIG. 14 is integrated on a semiconductor substrate, when the load driving device is operated at a high voltage within operating conditions, vertical parasitic bipolar transistors Q4 to Q7 formed to the transistors MN3, MN5, and MN7 become conductive, resulting in generation of a consumption current. The generation of the consumption current is described below.

In the case where the load driving device of the prior art is in a standby state, a P-well of each of the transistors MN3, MN5, and MN7 (a base of each of the parasitic bipolar transistors Q4 to Q7) is not electrically connected to a drain/source of each of the transistors MN3, MN5, and MN7 (an emitter of each of the parasitic bipolar transistors Q4 to Q7). As a result, the base of each parasitic bipolar transistor becomes open. Here, a breakdown voltage of each parasitic bipolar transistor can be represented by a breakdown voltage BVceo between an emitter and a collector when the base is open.

FIG. 13 is a graph showing breakdown voltage characteristics of a bipolar transistor. As is generally known, the breakdown voltage BVceo of the bipolar transistor when the base is open and a breakdown voltage BVcbo of the bipolar transistor when a potential is applied to the base have a correlation with a current amplification factor hFE as expressed by the following expression.

$$BVceo = BVcbo / \sqrt[4]{hFE} \quad (1)$$

In the development of a device, there is a tradeoff relation between the device size and the breakdown voltage. In this case, the breakdown voltage BVcbo is designed to have an optimum value. For instance, when a breakdown voltage of 40 V is required, the device is generally designed to have the breakdown voltage BVcbo of about 60 V.

The current amplification factor hFE of each of the parasitic bipolar transistors Q4 to Q7 shown in FIG. 14 is about 100, for example. That is, as shown in Expression (1), the breakdown voltage BVceo is about one-third of the breakdown voltage BVcbo.

Accordingly, in the case where the load driving device of the prior art is in the standby state, when a voltage higher than the breakdown voltage BVceo is applied to each of the parasitic bipolar transistors Q4 to Q7, the parasitic bipolar transistors Q4 to Q7 are broken down, with the result that a current flows through the parasitic bipolar transistors. This leads to an increase in the consumption current of the load driving device of the prior art.

Thus, in the load driving device of the prior art, the back gate of each transistor provided in the reverse connection protection circuit 15 and the back gate of each transistor provided in the back gate control circuit 16 become open (high impedance) when the load driving device is in the standby state. This causes a problem that a current flows through the parasitic bipolar transistors and the consumption current increases.

A first exemplary aspect of the present invention is a load driving device including: an output transistor coupled between a first power supply line and an output terminal, the output terminal being configured to be coupled with a load; a protection transistor that is provided between a gate of the output transistor and a second power supply line, and brings the output transistor into a conduction state when a polarity of a power supply coupled between the first power supply line and the second power supply line is reversed; and a back gate control circuit that controls the second power supply line and a back gate of the protection transistor to be brought into a conduction state in a standby mode when the polarity of the power supply is normal.

The circuit configuration as described above makes it possible to suppress heat generation in the output transistor and prevent breakdown of the load driving device when the power supply is reversely connected. Moreover, in the standby state when the power supply is normally connected, an increase in consumption current can be suppressed.

According to an exemplary aspect of the present invention, it is possible to provide a load driving device capable of suppressing heat generation in an output transistor and preventing breakdown of the load driving device when a power supply is reversely connected, and also capable of suppressing an increase in consumption current in a standby state when the power supply is normally connected.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the drawings. A repeated description is omitted as appropriate to clarify the explanation.

First Exemplary Embodiment

Figure 1:
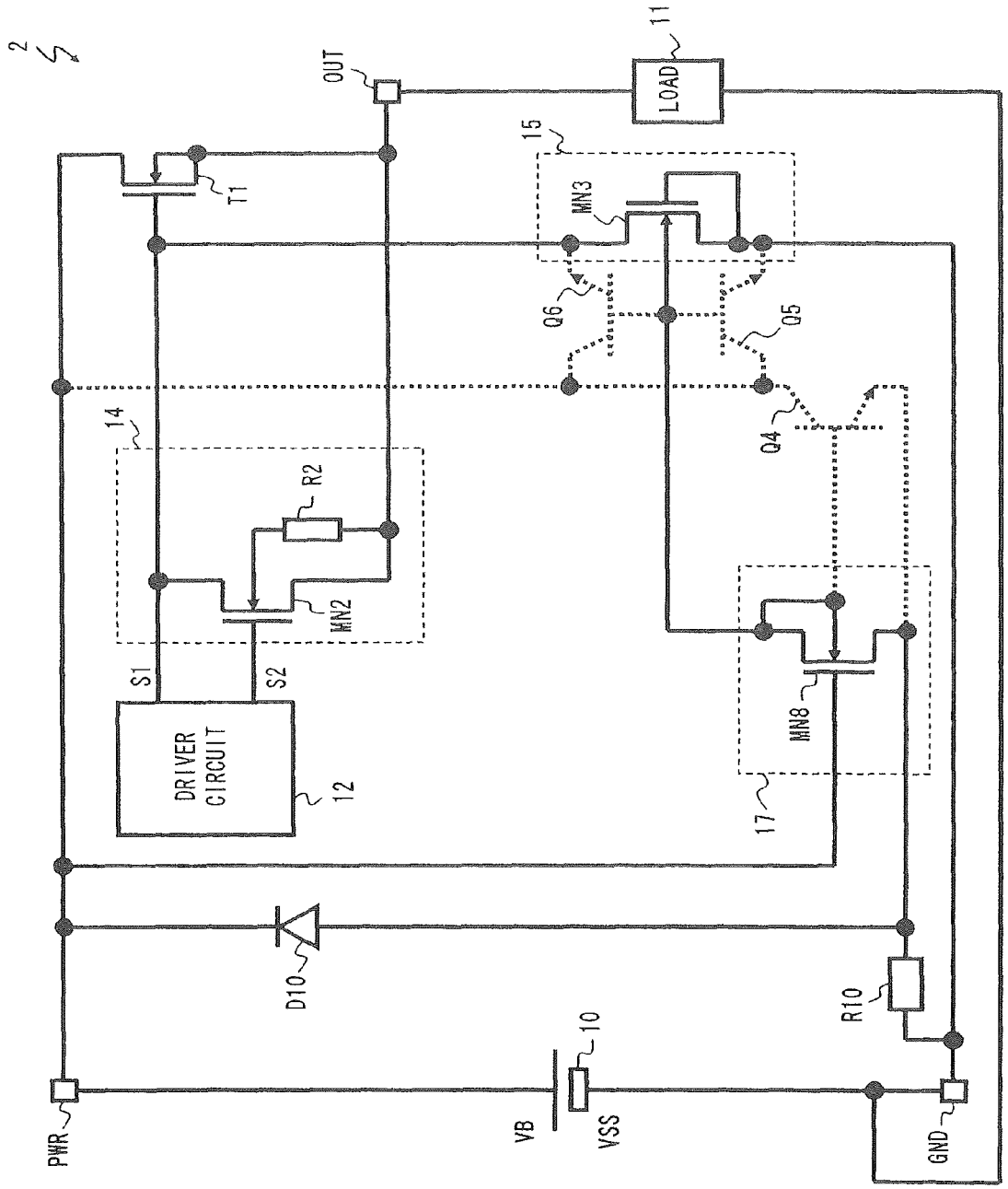
FIG. 1 is a circuit diagram of a load driving device according to a first exemplary embodiment of the present invention.

FIG. 1 shows a circuit diagram of a load driving device 2 according to a first exemplary embodiment of the present invention. As shown in FIG. 1, the load driving device 2 includes a power supply 10, a load 11, a driver circuit 12, a gate discharge circuit 14, a reverse connection protection circuit 15, a back gate control circuit 17, an output transistor T1, a clamp diode (protection diode) D10, a current restriction resistor R10, a power supply terminal PWR, a ground terminal GND, and an output terminal OUT. In the first exemplary embodiment, a power supply line that couples the power supply 10 and the output transistor T1 through the power supply terminal PWR is referred to as a first power supply line, and a power supply line that couples the power supply 10 through the ground terminal GND is referred to as a second power supply line.

The power supply 10 is coupled between the power supply terminal PWR and the ground terminal GND. At a time of normal connection, the power supply 10 supplies a positive-polarity-side voltage VB to the power supply terminal PWR, and a negative-polarity-side voltage VSS to the ground terminal GND. The load 11 is coupled between the output terminal OUT and the ground terminal GND. The load 11 is an actuator or a lamp, for example, and is a power supply destination in the load driving device 2.

The driver circuit 12 is a control device of the load driving device 2. The driver circuit 12 supplies a control signal S1 to a gate of the output transistor T1, and also supplies a control signal S2 to the gate discharge circuit 14. In the first exemplary embodiment, assume that the control signals S1 and S2 are signals having opposite phases. The driver circuit 12 controls a conduction state of the output transistor T1 according to the control signals S1 and S2.

The output transistor T1 has a drain coupled to the power supply terminal PWR, and a source coupled to the output terminal OUT. The control signal S1 is supplied to the gate of the output transistor T1. When the control signal S1 is at high level, the output transistor T1 is conductive. When the control signal S1 is at low level, the output transistor T1 is non-conductive. The gate discharge circuit 14 draws electric charges from the gate of the output transistor T1 when the control signal S2 is at high level. Meanwhile, when the control signal S2 is at low level, the gate discharge circuit 14 is non-conductive, and draws no electric charge from the gate of the output transistor T1.

More specifically, the gate discharge circuit 14 includes a discharge transistor MN2 and a resistor (a second resistor, e.g., a diffusion resistor) R2. The discharge transistor MN2 is an N-type MOS transistor formed on an N-type semiconductor substrate. The discharge transistor MN2 has a drain coupled to the gate of the output transistor T1, a gate supplied with the control signal S2, and a source coupled to the output terminal OUT. The resistor R2 is formed on the N-type semiconductor substrate using P-type diffusion regions. In the resistor R2, for example, resistor connecting terminals are formed at both ends of the resistor R2 using $P^+$ diffusion regions having a high impurity concentration. Further, a resistor portion is formed using a $P^-$ diffusion region having a low impurity concentration that connects the connecting terminals. One terminal of the resistor R2 is coupled to a back gate of the discharge transistor MN2, and the other terminal of the resistor R2 is coupled to the output terminal OUT.

The reverse connection protection circuit 15 is coupled between the gate of the output transistor T1 and the ground terminal GND. The reverse connection protection circuit 15 includes a protection transistor MN3. One of a source/drain of the protection transistor MN3 is coupled to the gate of the output transistor T1, and the other of the source/drain and a gate thereof are commonly coupled to the ground terminal GND. A back gate of the protection transistor MN3 is coupled to the back gate control circuit 17. When the power supply 10 is reversely connected, the drain of the protection transistor MN3 is coupled to the ground terminal GND, and the source thereof is coupled to the gate of the output transistor T1.

Parasitic bipolar transistors Q5 and Q6 are formed to the reverse connection protection circuit 15 as parasitic elements. More specifically, the parasitic bipolar transistor Q5 has a base connected to the back gate of the protection transistor MN3, an emitter connected to a source/drain diffusion region formed on the ground terminal GND side in the protection transistor MN3, and a collector coupled to the power supply terminal PWR. The parasitic bipolar transistor Q6 has a base connected to the back gate of the protection transistor MN3, an emitter connected to a source/drain diffusion region formed on the side of the gate of the output transistor T1 in the protection transistor MN3, and a collector coupled to the power supply terminal PWR.

The back gate control circuit 17 is coupled between the back gate of the protection transistor MN3 and the ground terminal GND. In the state where the power supply 10 is normally connected, the back gate control circuit 17 supplies a voltage according to the voltage of the ground terminal GND to the back gate of the protection transistor MN3. Meanwhile, in the state where the power supply 10 is reversely connected, the back gate control circuit 17 supplies a voltage according to the voltage of the power supply terminal PWR to the back gate of the protection transistor MN3.

More specifically, the back gate control circuit 17 includes a first N-type MOS transistor (a first transistor) MN8. The first N-type MOS transistor MN8 has a source coupled to the back gate of the protection transistor MN3, a drain coupled to the ground terminal GND through the current restriction resistor R10, and a gate coupled to the power supply terminal PWR. In the state where the power supply 10 is normally connected, the first N-type MOS transistor MN8 is conductive. Accordingly, the negative-polarity-side voltage VSS of the power supply 10 is applied to the back gate of the protection transistor MN3. In the first exemplary embodiment, the first N-type MOS transistor MN8 is coupled to the ground terminal GND through the current restriction resistor R10. However, when the power supply 10 is normally connected, the amount of current flowing through the back gate of the protection transistor MN3 is negligible. Thus, a voltage fluctuation in a path from the ground terminal GND to the back gate of the protection transistor MN3 is negligibly small.

A parasitic bipolar Q4 is formed to the back gate control circuit 17 as a parasitic element. More specifically, the parasitic bipolar Q4 has a base connected to a back gate of the first N-type MOS transistor MN8, an emitter connected to a source/drain diffusion region formed on the ground terminal GND side in the first N-type MOS transistor MN8, and a collector coupled to the power supply terminal PWR.

The current restriction resistor R10 and the clamp diode D10 are coupled in series between the ground terminal GND and the power supply terminal PWR. The clamp diode D10 has an anode coupled to the current restriction resistor R10, and a cathode coupled to the power supply terminal PWR.

Next, an operation of the load driving device 2 when the power supply 10 is normally connected will be described. When the control signal S1 is at high level and the control signal S2 is at low level, the discharge transistor MN2 is non-conductive and the output transistor T1 is conductive. Accordingly, the positive-polarity-side voltage VB output by the power supply 10 is supplied to the load 11 as power.

Meanwhile, when the control signal S1 is at low level and the control signal S2 is at high level, the discharge transistor MN2 is conductive, thereby drawing electric charges from the gate of the output transistor T1 to the output terminal OUT. As a result, the gate and source of the output transistor T1 are short-circuited by the discharge transistor MN2. This brings the output transistor T1 into a non-conduction state. Thus, no power is supplied to the load 11 from the power supply 10, and the voltage of the output terminal OUT is substantially 0 V. During the normal operation of the load driving device 2, almost no current flows through the back gate of the discharge transistor MN2. For this reason, a voltage substantially equal to the voltage of the output terminal OUT is applied to the back gate of the discharge transistor MN2.

In the state where the power supply 10 is normally connected, the first N-type MOS transistor MN8 is conductive, so the negative-polarity-side voltage VSS is applied to the back gate of the protection transistor MN3 through the current restriction resistor R10. In other words, the protection transistor MN3, which is coupled between the ground terminal GND and the gate of the output transistor T1, does not become conductive, with the result that the protection transistor MN3 is deactivated.

Figure 2:
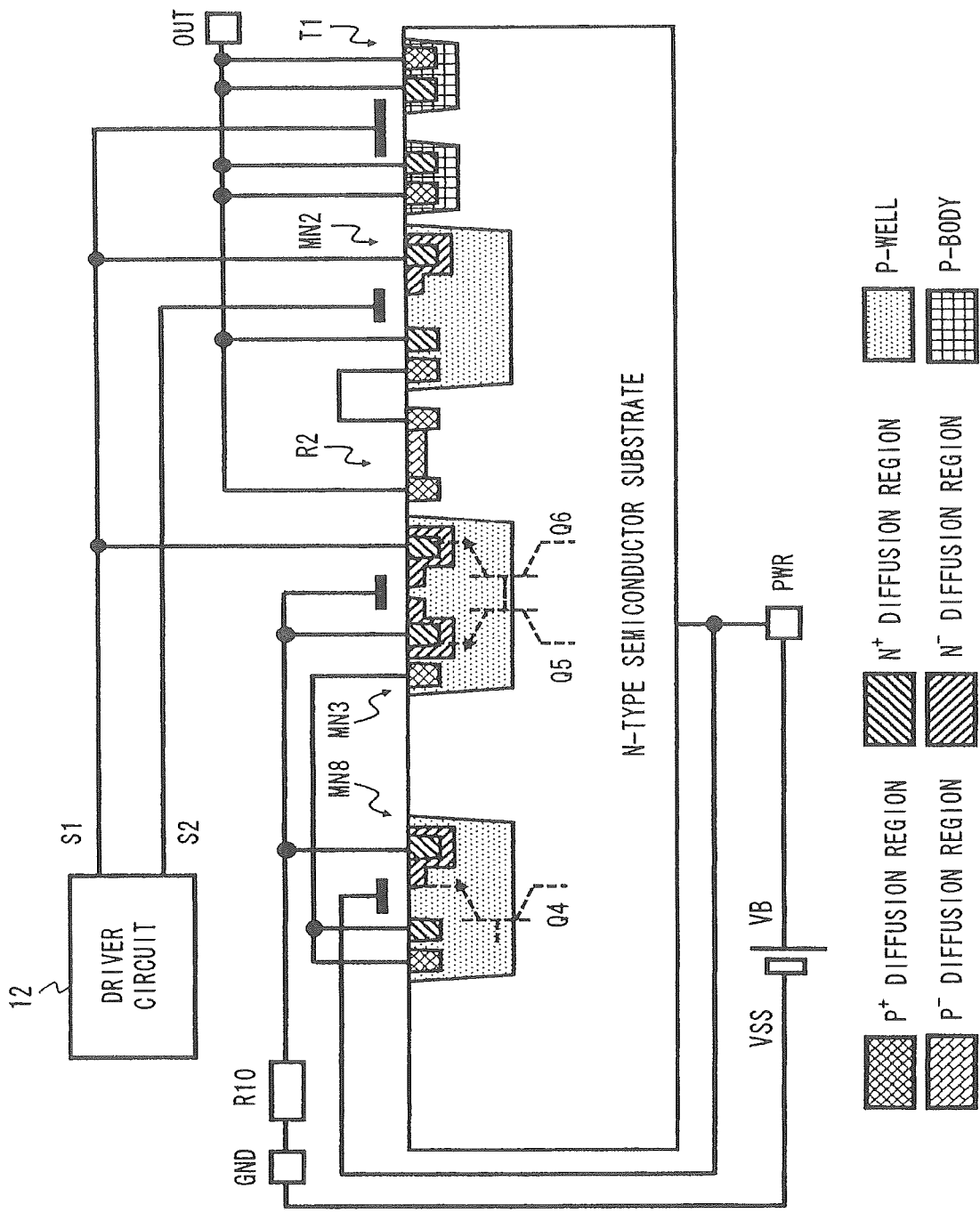
FIG. 2 is a sectional view of a semiconductor device illustrating parasitic elements formed in the load driving device according to the first exemplary embodiment of the present invention.

To explain the parasitic elements in more detail, FIG. 2 shows a sectional view illustrating the gate discharge circuit 14, the reverse connection protection circuit 15, the back gate control circuit 17, and the output transistor T1. The sectional view of FIG. 2 shows an example in which the gate discharge circuit 14, the reverse connection protection circuit 15, the back gate control circuit 17, and the output transistor T1 are formed on a single N-type semiconductor substrate.

As shown in FIG. 2, the resistor R2 is formed on the N-type semiconductor substrate using P-type diffusion regions. In the example shown in FIG. 2, resistor connecting terminals are formed at both ends of the resistor R2, using $P^+$ diffusion regions having a high impurity concentration. Further, a resistor portion is formed using a $P^-$ diffusion region having a low impurity concentration which connects the connecting terminals.

The discharge transistor MN2 of the gate discharge circuit 14 has a P-well (hereinafter, referred to as "back gate of the discharge transistor MN2" as needed) which is made of a P-type semiconductor and is formed on the N-type semiconductor substrate. In the P-well, a $P^+$ diffusion region and $N^+$ diffusion regions are formed. The $P^+$ diffusion region serves as a potential supply terminal for supplying a potential as a back gate voltage of the discharge transistor MN2 to the P-well. The $N^+$ diffusion regions form source and drain regions of the discharge transistor MN2. On the periphery of the $N^+$ diffusion region forming the drain, an $N^-$ diffusion region having a low impurity concentration is formed. The $N^-$ diffusion region provides a high breakdown voltage between the drain and the back gate of the discharge transistor MN2. Further, above an upper layer of the N-type semiconductor substrate, in a region extending over two $N^+$ diffusion regions, a gate electrode is formed via a gate oxide film.

The protection transistor MN3 of the reverse connection protection circuit 15 and the first N-type MOS transistor MN8 of the back gate control circuit 17 are composed of elements having substantially the same configuration as the discharge transistor MN2. The protection transistor MN3 has a configuration in which the $N^-$ diffusion region is formed on the periphery of each of the $N^+$ diffusion regions forming the source and the drain, and has a high breakdown voltage between the drain and the back gate and between the source and the back gate.

The output transistor T1 has P-body regions (hereinafter, referred to as "back gate of the output transistor T1" as needed) which are made of a P-type semiconductor and are formed on the N-type semiconductor substrate. Further, the output transistor T1 has an $N^+$ diffusion region and a $P^+$ diffusion region that are formed in each P-body region. The $N^+$ diffusion region serves as the source of the output transistor T1. The P-body regions are divided into two regions. In a region extending over the two N+ diffusion regions formed in the P-body regions, a gate electrode is formed via a gate oxide film. The output transistor T1 uses the N-type semiconductor substrate as the drain thereof. The $P^+$ diffusion region formed in each P-body region supplies the back gate voltage to the P-body region.

The parasitic bipolar Q4 has a base serving as the back gate of the first N-type MOS transistor MN8, an emitter serving as the $N^+$ diffusion region coupled to the resistor R10 in the first N-type MOS transistor MN8, and a collector serving as the N-type semiconductor substrate. The parasitic bipolar transistor Q5 has a base serving as the back gate of the protection transistor MN3, an emitter serving as the $N^+$ diffusion region coupled to the ground terminal GND in the protection transistor MN3, and a collector serving as the N-type semiconductor substrate. The parasitic bipolar transistor Q6 has a base serving as the back gate of the protection transistor MN3, an emitter serving as the $N^+$ diffusion region coupled to the gate of the output transistor T1, and a collector serving as the N-type semiconductor substrate.

In a typical NPN bipolar transistor, a breakdown voltage between a collector and an emitter thereof when a base of the NPN bipolar transistor is supplied with a fixed potential is higher than that when the base is open. In the prior art, the base of the parasitic bipolar transistor may be open. Thus, in the prior art, there is a possibility that the breakdown voltage BVceo between the collector and the emitter of the parasitic bipolar transistor decreases to a maximum applied voltage of the power supply 10 or lower.

In the first exemplary embodiment, a fixed potential is applied to the base of each of the parasitic bipolar transistors Q4, Q5, and Q6. As a result, the parasitic bipolar transistors Q4, Q5, and Q6 have a high breakdown voltage between the collector and the emitter thereof. The device is designed in advance such that the breakdown voltage between the collector and the emitter of each parasitic bipolar transistor at this time becomes higher than the maximum applied voltage of the power supply 10. Accordingly, the parasitic bipolar transistors Q4, Q5, and Q6 maintain the non-conductive state until the maximum applied voltage of the power supply 10 is reached.

As shown in FIGS. 1 and 2, the bases of the parasitic bipolar transistors Q4, Q5, and Q6 are each coupled to the wiring line of the back gate of the protection transistor MN3. Further, when the load driving device 2 is in a standby state (in the standby state in which no power is supplied from the output transistor T1 to the load 11), the first N-type MOS transistor MN8 is conductive. At this time, the negative-polarity-side voltage VSS is supplied to the bases of the parasitic bipolar transistors Q4, Q5, and Q6 through the ground terminal GND. This allows the parasitic bipolar transistors Q4, Q5, and Q6 to maintain the non-conduction state until the maximum applied voltage is reached. That is, since no current flows through the parasitic bipolar transistors, the load driving device 2 can suppress an increase in consumption current.

Figure 3:
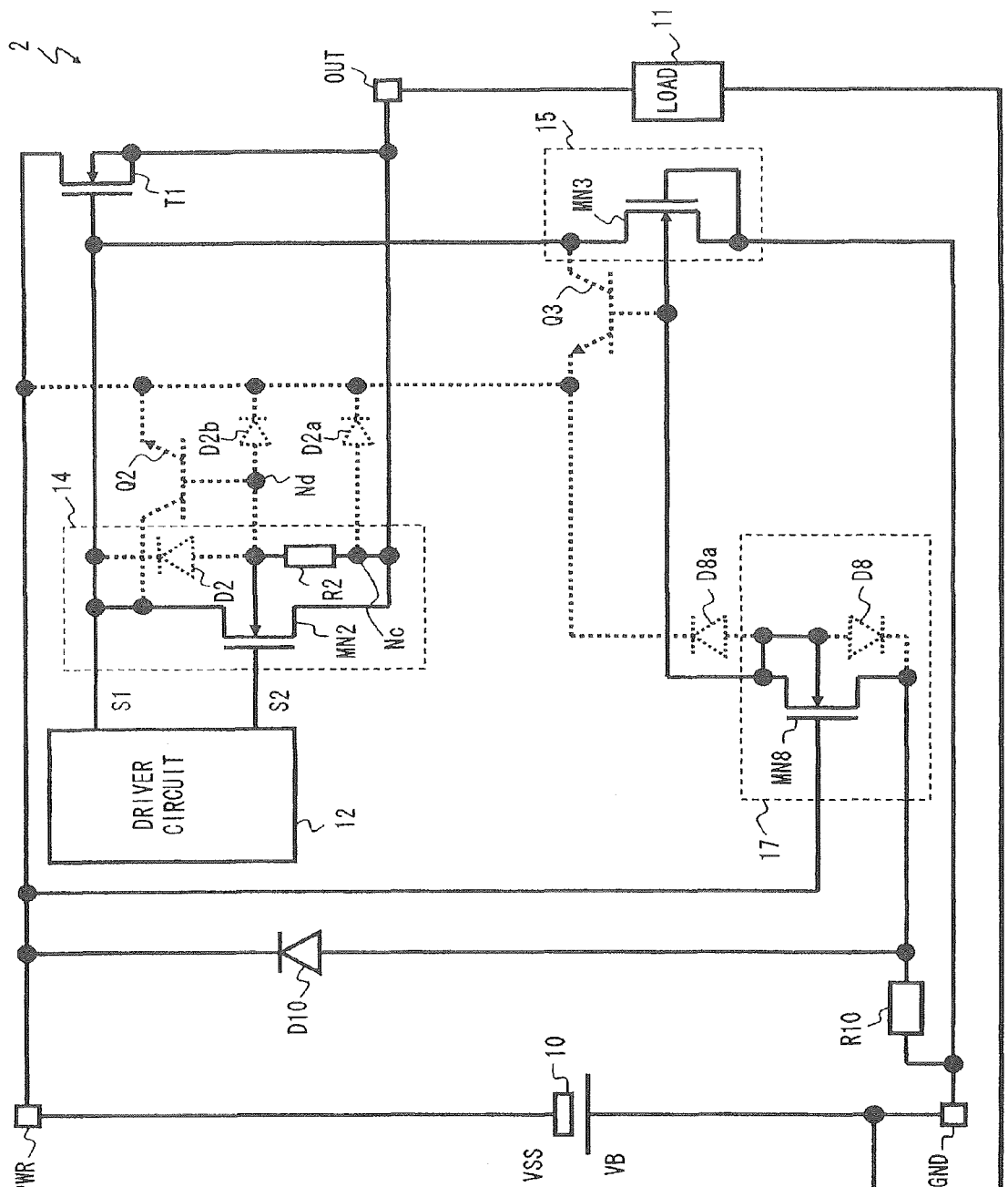
FIG. 3 is a circuit diagram showing a case where a power supply is reversely connected in the load driving device according to the first exemplary embodiment of the present invention.

Next, an operation of the load driving device 2 when the power supply 10 is reversely connected will be described. When the power supply 10 is reversely connected, parasitic elements are formed to the elements constituting the gate discharge circuit 14, the reverse connection protection circuit 15, and the back gate control circuit 17. However, the load driving device 2 according to the first exemplary embodiment can bring these parasitic elements into the non-conduction state. Accordingly, the load driving device 2 according to the first exemplary embodiment can control the output transistor T1 to be conductive and protect the output transistor T1, without being affected by the parasitic elements. FIG. 3 shows a circuit diagram of the load driving device when the power supply 10 is reversely connected.

As shown in FIG. 3, when the power supply 10 is reversely connected, the positive-polarity-side voltage VB of the power supply 10 is applied to the ground terminal GND and the negative-polarity-side terminal VSS of the power supply 10 is applied to the power supply terminal PWR. At this time, parasitic diodes D2, D2a, and D2b and a parasitic bipolar transistor Q2 are formed to the gate discharge circuit 14 as parasitic elements. Further, a parasitic bipolar transistor Q3 is formed to the reverse connection protection circuit 15 as a parasitic element. Furthermore, parasitic diodes D8 and D8a are formed to the back gate control circuit 17 as parasitic elements.

The parasitic diode D2 has an anode serving as the back gate of the discharge transistor MN2, and a cathode serving as the N$^+$ diffusion region coupled to the gate of the output transistor T1 in the discharge transistor MN2. That is, the parasitic diode D2 has an anode connected to the back gate of the discharge transistor MN2, and a cathode coupled to the gate of the output transistor T1.

The parasitic diode D2a has an anode coupled to the terminal on the output terminal OUT side of the resistor R2, and a cathode coupled to the power supply terminal PWR. The parasitic diode D2b has an anode coupled to a terminal of the resistor R2 on the back gate side of the discharge transistor MN2, and a cathode coupled to the power supply terminal PWR. The parasitic bipolar transistor Q2 has a collector connected to the drain of the discharge transistor MN2, a base connected to the back gate of the discharge transistor MN2, and an emitter coupled to the power supply terminal PWR.

The parasitic bipolar transistor Q3 has a collector coupled to the gate of the output transistor T1, a base connected to the back gate of the protection transistor MN3, and an emitter coupled to the power supply terminal PWR.

The parasitic diode D8 has an anode connected to the back gate of the first N-type MOS transistor MN8, and a cathode connected to the drain of the first N-type MOS transistor MN8. The parasitic diode D8a has an anode connected to the back gate of the first N-type MOS transistor MN8, and a cathode coupled to the power supply terminal PWR.

Figure 4:
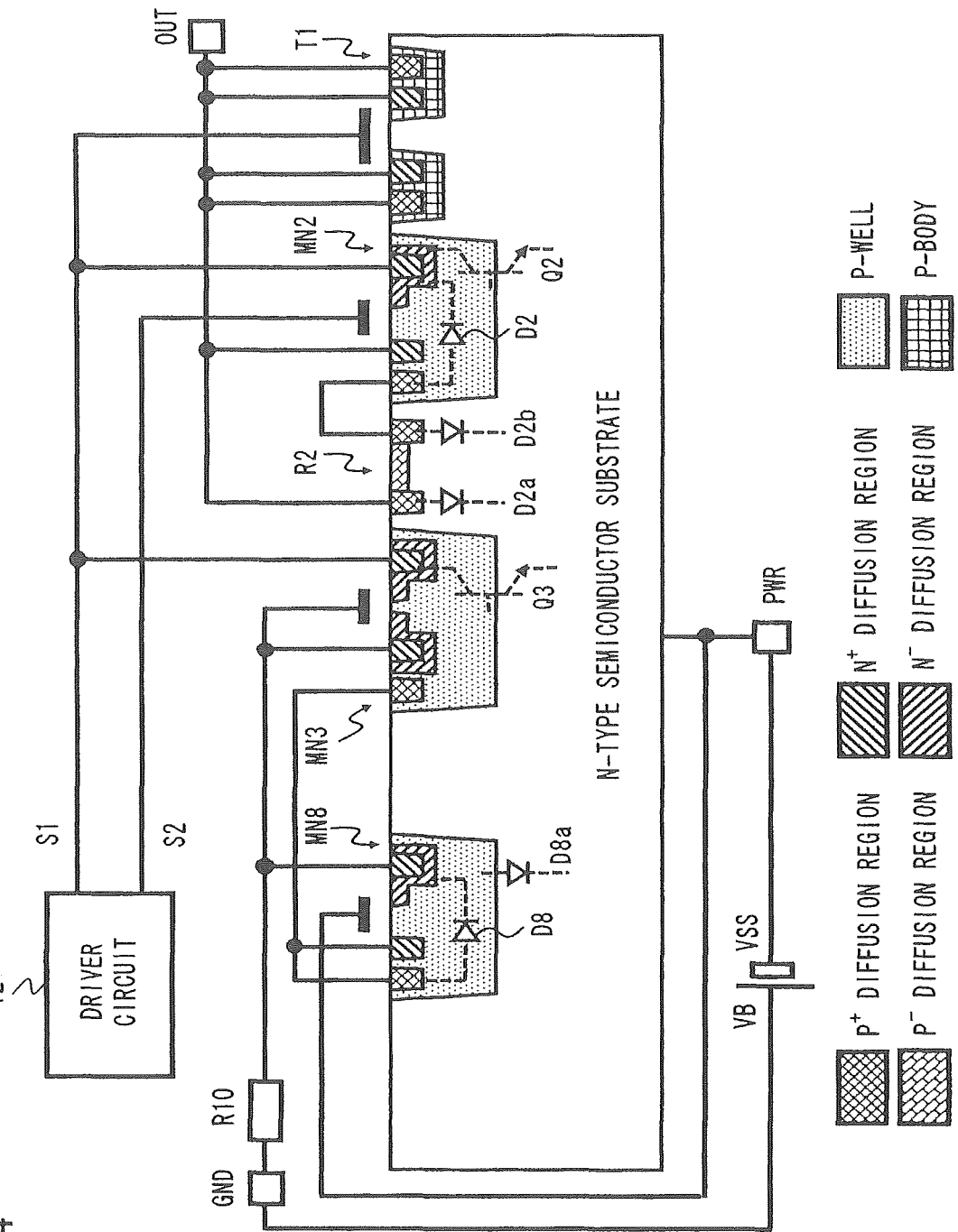
FIG. 4 is a sectional view of the semiconductor device illustrating the parasitic elements formed in the load driving device according to the first exemplary embodiment of the present invention.

To explain the parasitic elements in more detail, FIG. 4 shows a sectional view illustrating the gate discharge circuit 14, the reverse connection protection circuit 15, the back gate control circuit 17, and the output transistor T1. The sectional view of FIG. 4 shows an example in which the gate discharge circuit 14, the reverse connection protection circuit 15, the back gate control circuit 17, and the output transistor T1 are formed on a single N-type semiconductor substrate.

As shown in FIG. 4, the resistor R2, the discharge transistor MN2, the protection transistor MN3, the first N-type MOS transistor MN8, and the output transistor T1 have substantially the same configurations as those of the load driving device 2 shown in FIG. 2.

The parasitic bipolar transistor Q2 has a base serving as the back gate of the discharge transistor MN2, an emitter serving as the N-type semiconductor substrate, and a collector serving as the N$^+$ diffusion region coupled to the gate of the output transistor T1 in the discharge transistor MN2.

The parasitic bipolar transistor Q3 has a base serving as the back gate of the protection transistor MN3, an emitter serving as the N-type semiconductor substrate, and a collector serving as the N$^+$ diffusion region coupled to the gate of the output transistor T1 in the protection transistor MN3.

The parasitic diode D2 has an anode serving as the back gate of the discharge transistor MN2, and a cathode serving as the N$^+$ diffusion region coupled to the gate of the output transistor T1 in the discharge transistor MN2. The parasitic diode D2a has an anode serving as the P$^+$ diffusion region coupled to the output terminal OUT in the resistor R2, and a cathode serving as the N-type semiconductor substrate. The parasitic diode D2b has an anode serving as the P$^+$ diffusion region coupled to the back gate of the discharge transistor MN2 in the resistor R2, and a cathode serving as the N-type semiconductor substrate.

The parasitic diode D8 has an anode serving as the back gate of the first N-type MOS transistor MN8, and a cathode serving as the N$^+$ diffusion region coupled to the resistor R10 in the first N-type MOS transistor MN8. The parasitic diode D8a has an anode serving as the back gate of the first N-type MOS transistor MN8, and a cathode serving as the N-type semiconductor substrate.

Here, an operation of the load driving device 2 when the power supply 10 is reversely connected is described. When the power supply 10 is reversely connected, the positive-polarity-side voltage VB is applied to the gate of the protection transistor MN3. This brings the protection transistor MN3 into the conduction state. However, there is a transition period before the output transistor T1 becomes conductive. During this transition period, a voltage at the output terminal OUT is equal to a forward voltage (about 0.7 V) of a parasitic diode formed in the output transistor T1. This is because the parasitic diode of the output transistor T1 is temporarily forward biased. After that, the output transistor T1 becomes conductive, and the voltage at the output terminal OUT becomes about 0 V ((on-resistance of output transistor T1)×(load current at the time of reverse connection of a battery)).

When the power supply 10 is reversely connected, the electric charges on the source side of the output transistor T1 temporarily flow through the gate of the output transistor T1 through the resistor R2 and the parasitic diode D2 until the protection transistor MN3 becomes conductive. The operation at this time is described in more detail below.

Referring to FIG. 3, Nc denotes a node on the anode side of the parasitic diode D2a, and Nd denotes a node on the anode side of the parasitic diode D2b. The base of the parasitic bipolar transistor Q2 is connected to the node Nd. The cathodes of the parasitic diodes D2a and D2b are each connected to a region common to the emitter of the parasitic bipolar transistor Q2. Accordingly, a voltage generated between the anode and the cathode of the parasitic diode D2b is equal to a voltage between the base and the emitter of the parasitic bipolar transistor Q2.

As shown in FIG. 3, when the power supply 10 is reversely connected, a current flows from the output terminal OUT to the power supply terminal PWR through the parasitic diode D2a. In addition, a current flows from the output terminal OUT to the power supply terminal PWR through the resistor R2 and the parasitic diode D2b. As a result, a voltage of the node Nd is lower than a voltage of the node NC which is determined by a resistance value of the resistor R2 and a current flowing through the resistor R2. Specifically, the voltage of the node Nc becomes about 0.7 V, while the voltage of the node Nd becomes about 0.5 V due to voltage drop of the resistor R2. In this case, a threshold voltage of the parasitic bipolar transistor Q2 is higher than 0.5 V. This indicates that, when the voltage of the node Nd is about 0.5 V, the voltage between the base and the emitter of the parasitic bipolar transistor Q2 does not exceed the threshold voltage. For this reason, in the first exemplary embodiment, a current path that couples the gate of the output transistor T1 and the power supply terminal PWR through the parasitic bipolar transistor Q2 is not formed.

Thus, the electric charges flowing to the gate of the output transistor T1 through the protection transistor MN3 are not drawn by the parasitic bipolar transistor Q2. Accordingly, the load driving device according to the first exemplary embodiment can supply electric charges to the gate of the output transistor T1 through the protection transistor MN3 without being affected by the parasitic bipolar transistor Q2. This renders the output transistor T1 conductive.

Meanwhile, in the first exemplary embodiment, since the clamp diode D10 is forward biased, a current flows from the ground terminal (TND) to the power supply terminal PWR through the current restriction resistor R10 and the clamp diode D10. Specifically, a forward voltage (e.g., about 0.7 V) of the clamp diode D10 is generated at a node between the current restriction resistor R10 and the clamp diode D10.

The negative-polarity-side voltage VSS is supplied to the gate of the first N-type MOS transistor MN8. Further, the back gate of the protection transistor MN3 is coupled to the back gate of the first N-type MOS transistor MN8. Since the parasitic diode D8 is reversely biased in this case, no current flows from the resistor R10 to the back gate of the protection transistor MN3 through the parasitic diode D8. Instead, the negative-polarity-side voltage VSS is supplied to the back gate of the protection transistor MN3 through the parasitic diode D8a. As a result, the first N-type MOS transistor MN8 maintains the non-conduction state, and the protection transistor MN3 becomes conductive.

In this manner, when the power supply 10 is reversely connected, the first N-type MOS transistor MN8 does not become conductive until the output transistor T1 becomes conductive. This prevents the parasitic bipolar transistor Q3 from drawing the electric charges which flow to the gate of the output transistor T1 through the protection transistor MN3.

When the power supply 10 is reversely connected, a voltage higher than the gate voltage of the output transistor T1 is applied to the ground terminal GND, thereby bringing the protection transistor MN3 into a normal conduction state. Thus, a voltage obtained by subtracting an on-voltage of the protection transistor MN3 from the positive-polarity-side voltage VB of the power supply 10 is applied to the gate of the output transistor T1. This brings the output transistor T1 into the conduction state. After that, the output transistor T1 maintains the conduction state.

When the output transistor T1 is conductive, a voltage substantially equal to 0 V is supplied to the output terminal OUT. Accordingly, the voltage at the node Nd is substantially equal to 0 V. Thus, the parasitic bipolar transistor Q2 maintains the non-conduction state. This prevents the output transistor T1 from becoming non-conductive under the influence of the parasitic bipolar transistor Q2. A voltage on a signal line coupling the back gate of the protection transistor MN3 and the back gate and source of the transistor MN8 is substantially equal to 0 V, so the parasitic bipolar transistor Q3 maintains the non-conduction state. This prevents the output transistor T1 from becoming non-conductive under the influence of the parasitic bipolar transistor Q3.

As described above, the load driving device 2 according to the first exemplary embodiment renders the first N-type MOS transistor MN8 conductive in the standby state when the power supply 10 is normally connected. Thus, the load driving device 2 according to the first exemplary embodiment supplies the fixed potential from the ground terminal GND to the back gate of the protection transistor MN3. Accordingly, the breakdown voltage between the collector and the emitter of each of the parasitic bipolar transistors Q4 to Q6 is maintained at the maximum applied voltage of the power supply 10 or higher. In other words, the load driving device 2 according to the first exemplary embodiment maintains the parasitic bipolar transistors Q4 to Q6 in the non-conduction state even when the power supply 10 applies a high voltage. Consequently, the load driving device 2 can suppress an increase in consumption current.

Furthermore, the load driving device 2 according to the first exemplary embodiment includes the gate discharge circuit 14 between the gate of the output transistor T1 and the output terminal OUT. This enables the load driving device 2 to reliably control the non-conduction state of the output transistor T1 during the normal operation, even if there is a potential difference between the ground voltage of the load 11 and the voltage at the ground terminal of the load driving device 2. In short, the load driving device 2 can reliably control the non-conduction state of the output transistor T1 during the normal operation, regardless of the connection condition of the load 11.

Moreover, the load driving device 2 according to the first exemplary embodiment includes the discharge transistor MN2 and the resistor R2. This enables the load driving device 2 to maintain the non-conduction state of the parasitic bipolar transistor Q2 when the power supply 10 is reversely connected. Thus, the load driving device 2 allows the protection transistor MN3 to reliably operate when the power supply 10 is reversely connected. Specifically, when the power supply 10 is reversely connected, the load driving device 2 brings the output transistor T1 into the conduction state with high accuracy by using the protection transistor MN3. Consequently, the load driving device 2 can suppress heat generation in the transistor T1, thereby preventing breakdown of the load driving device 2.

Second Exemplary Embodiment

A load driving device 3 according to a second exemplary embodiment of the present invention will be described with reference to the drawings. The load driving device 3 includes a back gate control circuit 17b which is a modified example of the back gate control circuit 17 according to the first exemplary embodiment. The load driving device 3 also includes a reverse connection protection circuit 15b which is a modified example of the reverse connection protection circuit 15 according to the first exemplary embodiment. The components of the load driving device 3 that are similar to those of the load driving device 2 are denoted by the same reference symbols, and the description thereof is omitted.

In comparison with the back gate control unit 17 of the load driving device 2, the back gate control circuit 17b of the load driving device 3 causes the back gate of the protection transistor MN3 to be short-circuited to the potential of the output terminal OUT with a low impedance when the power supply 10 is reversely connected, thereby obtaining a more stable operation.

Figure 5:
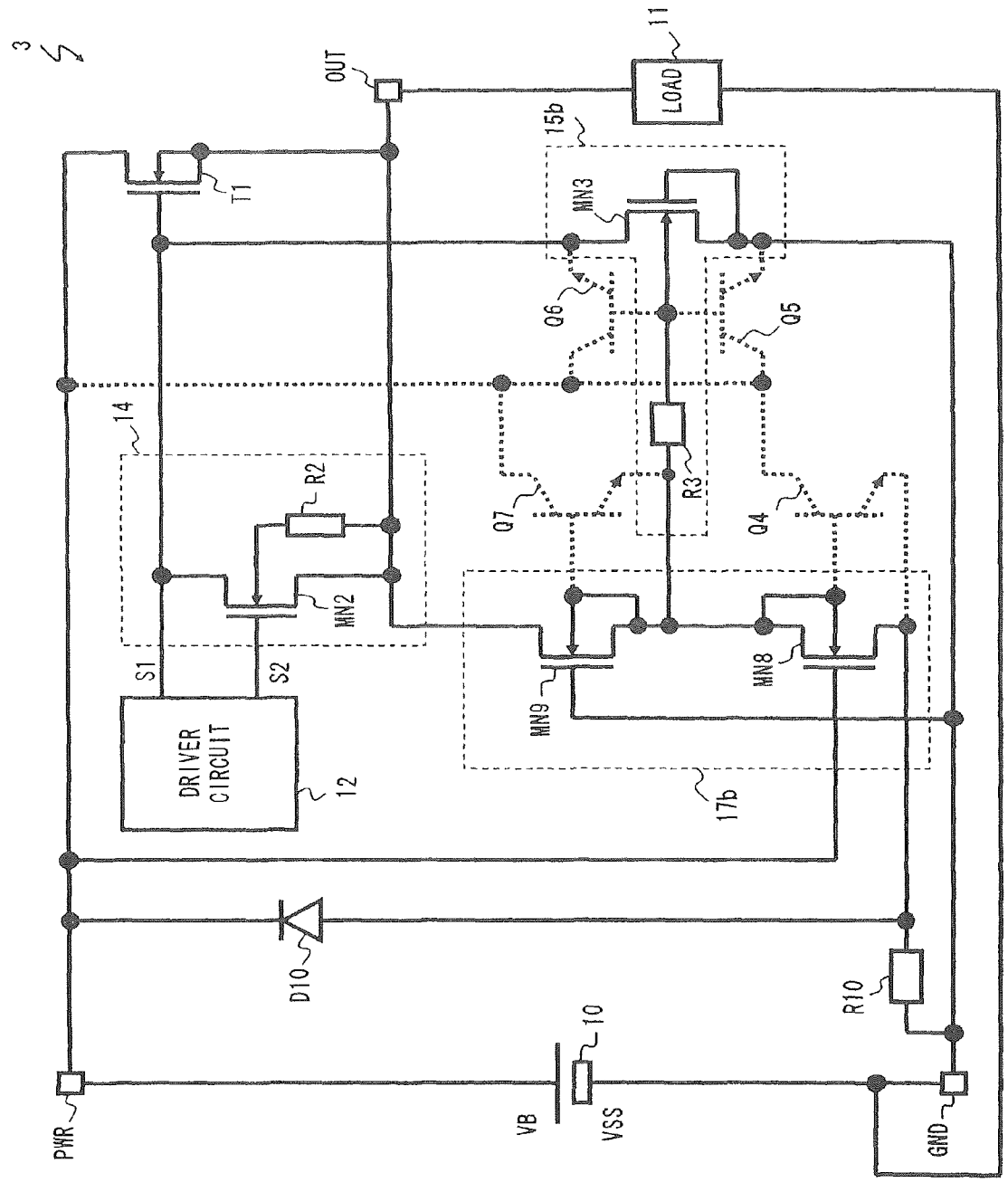
FIG. 5 is a circuit diagram of a load driving device according to a second exemplary embodiment of the present invention.

FIG. 5 shows a circuit diagram of the load driving device 3 when the power supply is normally connected. The reverse connection protection circuit 15b is coupled between the gate of the output transistor T1 and the ground terminal GND. The reverse connection protection circuit 15b includes the protection transistor MN3 and a resistor (a first resistor, e.g., a diffusion resistor) R3. One of the source/drain of the protection transistor MN3 is coupled to the gate of the output transistor T1, and the other of the source/drain and the gate thereof are commonly coupled to the ground terminal GND. The back gate of the protection transistor MN3 is coupled to the back gate control circuit 17b through the resistor R3. When the power supply 10 is reversely connected, the drain of the protection transistor MN3 is coupled to the ground terminal GND, and the source thereof is coupled to the gate of the output transistor T1. The resistor R3 has the same configuration as the resistor R2 described above. The resistor R3 has one terminal coupled to the back gate of the protection transistor MN3, and the other terminal coupled to the back gate control circuit 17b.

The back gate control circuit 17b is provided among the other terminal of the resistor R3, the output terminal OUT, and the ground terminal GND. In the state where the power supply 10 is normally connected, the back gate control circuit 17b supplies a voltage according to the voltage of the ground terminal GND to the back gate of the protection transistor MN3. Meanwhile, in the state where the power supply 10 is reversely connected, the back gate control circuit 17b supplies a voltage according to the voltage of the output terminal OUT to the back gate of the protection transistor MN3.

The back gate control circuit 17b includes the first N-type MOS transistor MN8 and a second N-type MOS transistor (a second transistor) MN9. In the state where the power supply 10 is normally connected, the first N-type MOS transistor MN8 is conductive. Accordingly, the first N-type MOS transistor MN8 supplies the negative-polarity-side voltage VSS of the power supply 10 to the back gate of the protection transistor MN3. At this time, the second N-type MOS transistor MN9 becomes non-conductive. In the second exemplary embodiment, the first N-type MOS transistor MN8 is coupled to the ground terminal GND through the current restriction resistor R10. However, when the power supply 10 is normally connected, the amount of current flowing through the protection transistor MN3 is negligible. Thus, a voltage fluctuation in a path from the ground terminal GND to the back gate of the protection transistor MN3 is negligibly small.

More specifically, the first N-type MOS transistor MN8 has a source coupled to the other terminal of the resistor R3, a drain coupled to the ground terminal GND through the current restriction resistor R10, and a gate coupled to the power supply terminal PWR. The second N-type MOS transistor MN9 has a drain coupled to the output terminal OUT, a source coupled to the other terminal of the resistor R3, and a gate coupled to a node between the current restriction resistor R10 and the ground terminal GND.

Figure 6:
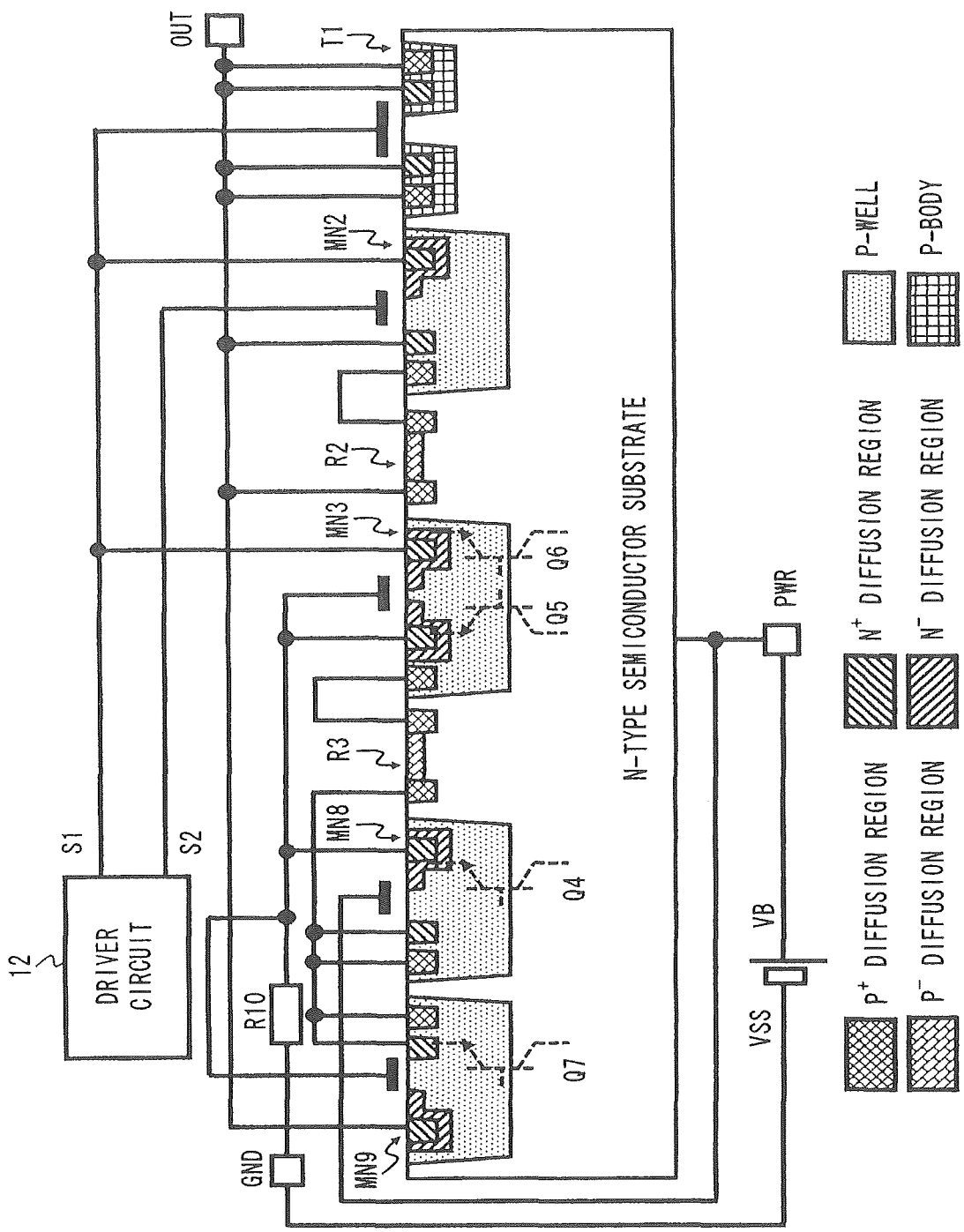
FIG. 6 is a sectional view of a semiconductor device illustrating parasitic elements formed in the load driving device according to the second exemplary embodiment of the present invention.

To explain the parasitic elements in more detail, FIG. 6 shows a sectional view illustrating the gate discharge circuit 14, the reverse connection protection circuit 15b, the back gate control circuit 17b, and the output transistor T1. The components similar to those of the load driving device 2 shown in the sectional view of FIG. 2 are denoted by the same reference symbols as those of the load driving device 2, and the description thereof is omitted.

As shown in FIG. 6, the resistor R3 is formed on the N-type semiconductor substrate using P-type diffusion regions. In the example shown in FIG. 6, at both ends of the resistor R3, resistor connecting terminals are formed using $P^+$ diffusion regions having a high impurity concentration. Further, a resistor portion is formed using a $P^-$ diffusion region having a low impurity concentration which connects the connecting terminals.

The second N-type MOS transistor MN9 of the back gate control circuit 17b is composed of elements having substantially the same configuration as the first N-type MOS transistor MN8.

Further, a parasitic bipolar transistor Q7 is formed. The parasitic bipolar transistor Q7 has a base serving as a back gate of the second N-type MOS transistor MN9, an emitter serving as the $N^+$ diffusion region coupled to the other terminal of the resistor R3 in the second N-type MOS transistor MN9, and a collector serving as the N-type semiconductor substrate.

Next, an operation of the load driving device 3 when the power supply 10 is normally connected will be described. In the state where the power supply 10 is normally connected, the first N-type MOS transistor MN8 is conductive, and the second N-type MOS transistor MN9 is non-conductive. As a result, the negative-polarity-side voltage VSS is applied to the back gate of the protection transistor MN3 through the resistor R3 and the current restriction resistor R10. In this case, the protection transistor MN3, which is coupled between the ground terminal GND and the gate of the output transistor T1, does not become conductive. In other words, the protection transistor MN3 is deactivated.

In this manner, in the load driving device 3, the negative-polarity-side voltage VSS is supplied to the back gate of the protection transistor MN3 from the ground terminal GND, as with the load driving device 2 of the first exemplary embodiment. This allows the parasitic bipolar transistors Q4 to Q7 to maintain the non-conduction state until the maximum applied voltage is reached. In short, since no current flows through the parasitic bipolar transistors Q4 to Q7, the load driving device 3 can suppress an increase in consumption current.

Figure 7:
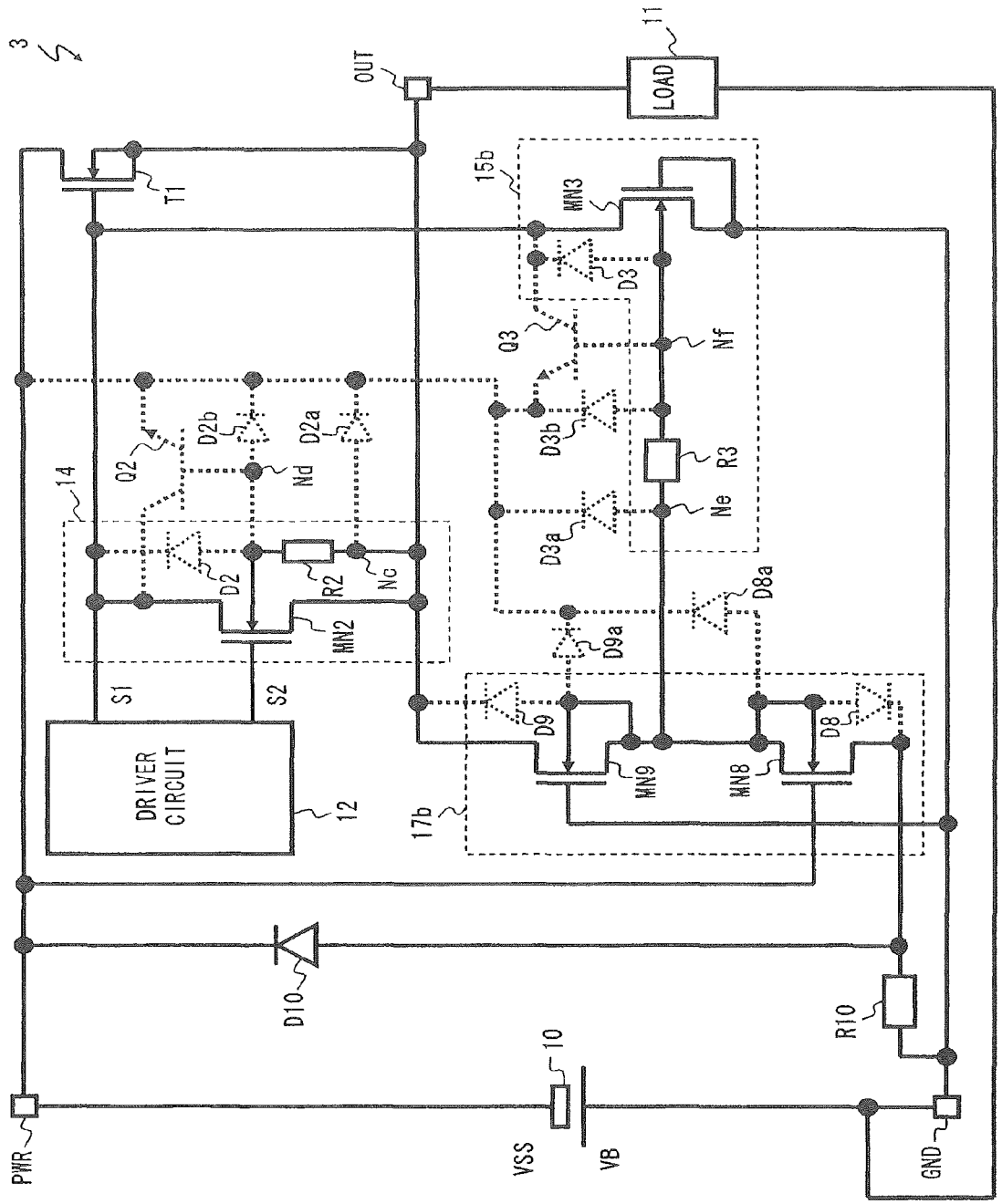
FIG. 7 is a circuit diagram showing a case where a power supply is reversely connected in the load driving device according to the second exemplary embodiment of the present invention.

Next, an operation of the load driving device 3 when the power supply 10 is reversely connected will be described. When the power supply 10 is reversely connected, parasitic elements are formed to the elements constituting the gate discharge circuit 14, the reverse connection protection circuit 15b, and the back gate control circuit 17b. The load driving device 3 brings these parasitic elements into the non-conduction state, thereby allowing a current to flow to the gate of the output transistor T1 through the reverse connection protection circuit 15b. FIG. 7 shows a circuit diagram of the load driving device when the power supply 10 is reversely connected.

As shown in FIG. 7, when the power supply 10 is reversely connected, the positive-polarity-side voltage VB of the power supply 10 is applied to the ground terminal GND, and the negative-polarity-side terminal VSS of the power supply 10 is applied to the power supply terminal PWR. At this time, parasitic diodes D3, D3a, and D3b and the parasitic bipolar transistor Q3 are formed to the reverse connection protection circuit 15b as parasitic elements. Parasitic diodes D9 and D9a are formed to the back gate control circuit 17b, in addition to the parasitic diodes D8 and D8a. The parasitic elements formed to the gate discharge circuit 14 are similar to those of the circuit shown in FIG. 3, so the description thereof is omitted.

Figure 8:
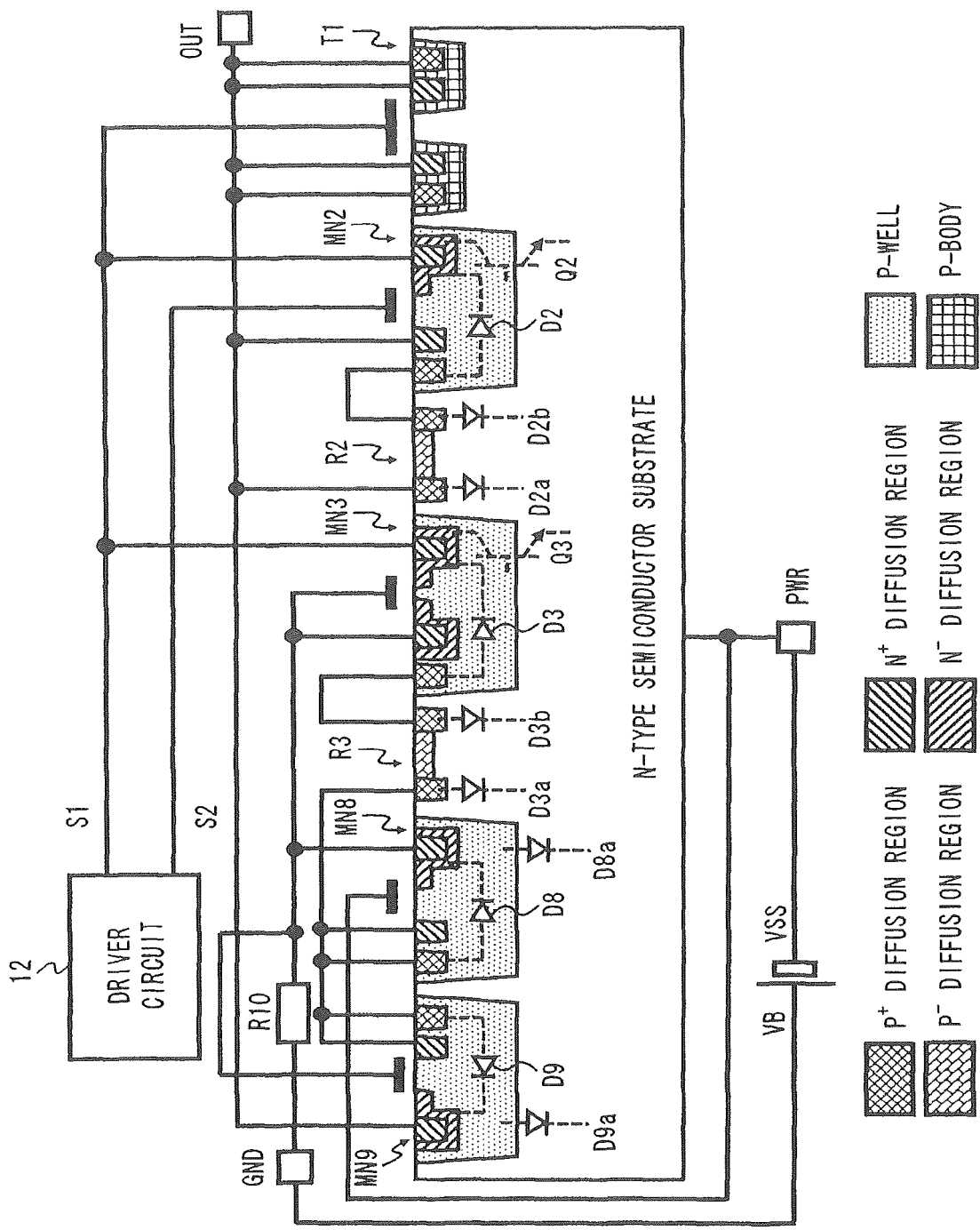
FIG. 8 is a sectional view of the semiconductor device illustrating the parasitic elements formed in the load driving device according to the second exemplary embodiment of the present invention.

To explain these parasitic elements in more detail, FIG. 8 shows a sectional view illustrating the gate discharge circuit 14, the reverse connection protection circuit 15b, the back gate control circuit 17b, and the output transistor T1. The sectional view of FIG. 8 shows an example in which the gate discharge circuit 14, the reverse connection protection circuit 15b, the back gate control circuit 17b, and the output transistor T1 are formed on a single N-type semiconductor substrate.

As shown in FIG. 8, the resistor R2, the resistor R3, the discharge transistor MN2, the protection transistor MN3, the first N-type MOS transistor MN8, the second N-type MOS transistor MN9, and the output transistor T1 have substantially the same configurations as those of the load driving device 3 shown in FIG. 6.

The parasitic diode D3 has an anode serving as the back gate of the protection transistor MN3, and a cathode serving as the N$^+$ diffusion region coupled to the gate of the output transistor T1 in the protection transistor MN3. That is, the parasitic diode D3 has an anode connected to the back gate of the protection transistor MN3, and a cathode coupled to the gate of the output transistor T1.

The parasitic diode D3a has an anode connected to a terminal of the resistor R3 on the back gate control circuit 17b side, and a cathode coupled to the power supply terminal PWR. The parasitic diode D3b has an anode connected to a terminal of the resistor R3 on the back gate side of the protection transistor MN3, and a cathode coupled to the power supply terminal PWR. The parasitic bipolar transistor Q3 has a collector connected to the N$^+$ diffusion region on the gate side of the output transistor T1 in the protection transistor MN3, a base connected to the back gate of the protection transistor MN3, and an emitter coupled to the power supply terminal PWR.

The parasitic diode D9 has an anode connected to the back gate of the second N-type MOS transistor MN9, and a cathode connected to the N$^+$ diffusion region coupled to the output terminal OUT in the second N-type MOS transistor MN9. The parasitic diode D9a has an anode connected to the back gate of the second N-type MOS transistor MN9, and a cathode connected to the N-type semiconductor substrate. The parasitic diodes D8, D8a, D2, D2a, and D2b and the parasitic bipolar transistor Q2 are similar to those shown in FIG. 4, so the description thereof is omitted.

In this case, as with the load driving device 2 of the first exemplary embodiment, the first N-type MOS transistor MN8 maintains the non-conduction state. On the other hand, the second N-type MOS transistor MN9 maintains the conduction state. The reason for this is described below. The positive-polarity-side voltage VB is supplied to the gate of the second N-type MOS transistor MN9. Further, the back gate of the second N-type MOS transistor MN9 is coupled to the back gate of the protection transistor MN3 through the resistor R3. Since the parasitic diode D9 is reversely biased in this case, no current flows from the output terminal OUT side to the back gate of the protection transistor MN3 through the parasitic diode D9. Instead, the negative-polarity-side voltage VSS is supplied through the parasitic diode D9a. This brings the second N-type MOS transistor MN9 and the protection transistor MN3 into the conduction state.

When the power supply 10 is reversely connected, the first N-type MOS transistor MN8 does not become conductive until the output transistor T1 becomes conductive. This prevents the parasitic bipolar transistor Q3 from drawing the electric charges that flow to the gate of the output transistor T1 through the protection transistor MN3.

However, when the power supply 10 is reversely connected, before the output transistor T1 is conductive, there is a period in which the second N-type MOS transistor MN9 exhibits a conduction state. At this time, a current path from the output terminal OUT to the back gate of the protection transistor MN3 is formed.

In this case, the forward voltage of the parasitic diode D3a is maintained at high level (e.g., about 0.7 V). However, since the current flowing through the parasitic diode D3b is restricted by the resistor R3, the forward voltage is maintained at low level (e.g., about 0.5 V or lower). This prevents the parasitic bipolar transistor Q3 from becoming conductive under the influence of the parasitic diodes D3a and D3b. Thus, the electric charges flowing to the gate of the output transistor T1 through the protection transistor MN3 are prevented from being drawn by the parasitic bipolar transistor Q3.

When the power supply 10 is reversely connected, a voltage higher than the gate voltage of the output transistor T1 is applied to the ground terminal GND, thereby bringing the protection transistor MN3 into the normal conduction state. Thus, a voltage obtained by subtracting an on-voltage of the protection transistor MN3 from the positive-polarity-side voltage VB of the power supply 10 is applied to the gate of the output transistor T1. This brings the output transistor T1 into the conduction state. After that, the output transistor T1 maintains the conduction state. In this manner, the same effects as those of the first exemplary embodiment can also be obtained in the load driving device 3 of the second exemplary embodiment.

Third Exemplary Embodiment

Figure 9:
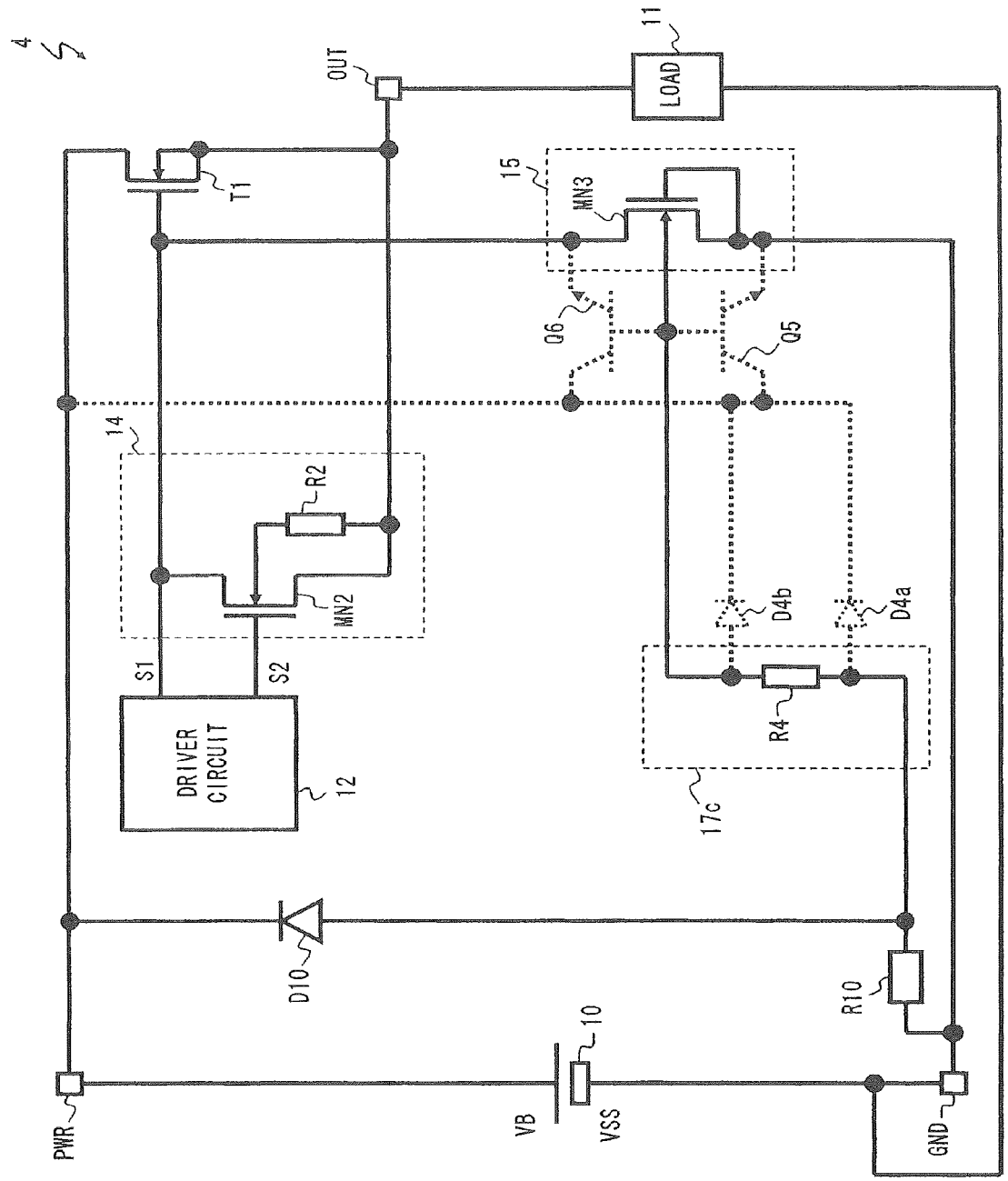
FIG. 9 is a circuit diagram of a load driving device according to a third exemplary embodiment of the present invention.
Figure 10:
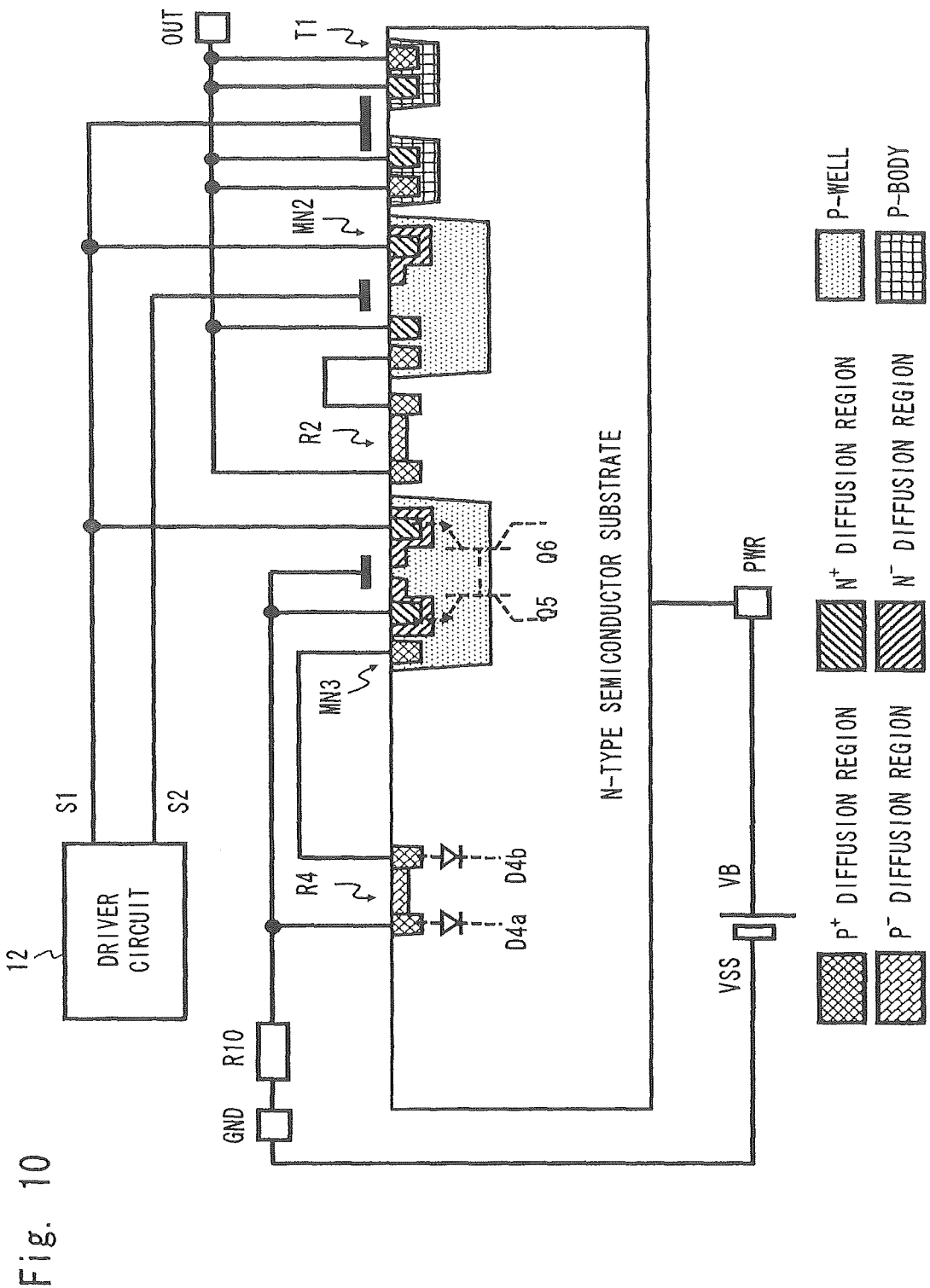
FIG. 10 is a sectional view of a semiconductor device illustrating parasitic elements formed in the load driving device according to the third exemplary embodiment of the present invention.
Figure 11:
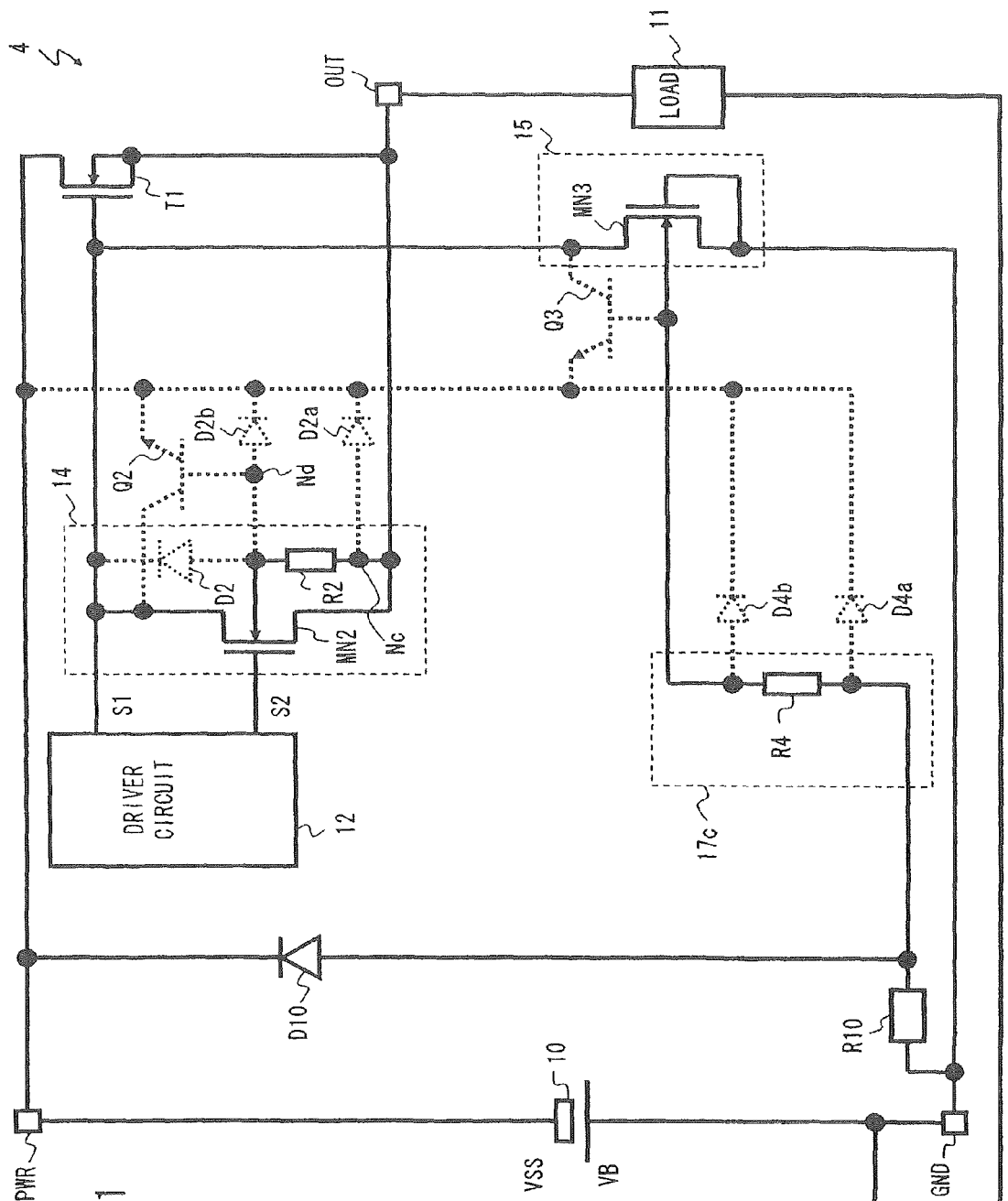
FIG. 11 is a circuit diagram showing a case where a power supply is reversely connected in the load driving device according to the third exemplary embodiment of the present invention.
Figure 12:
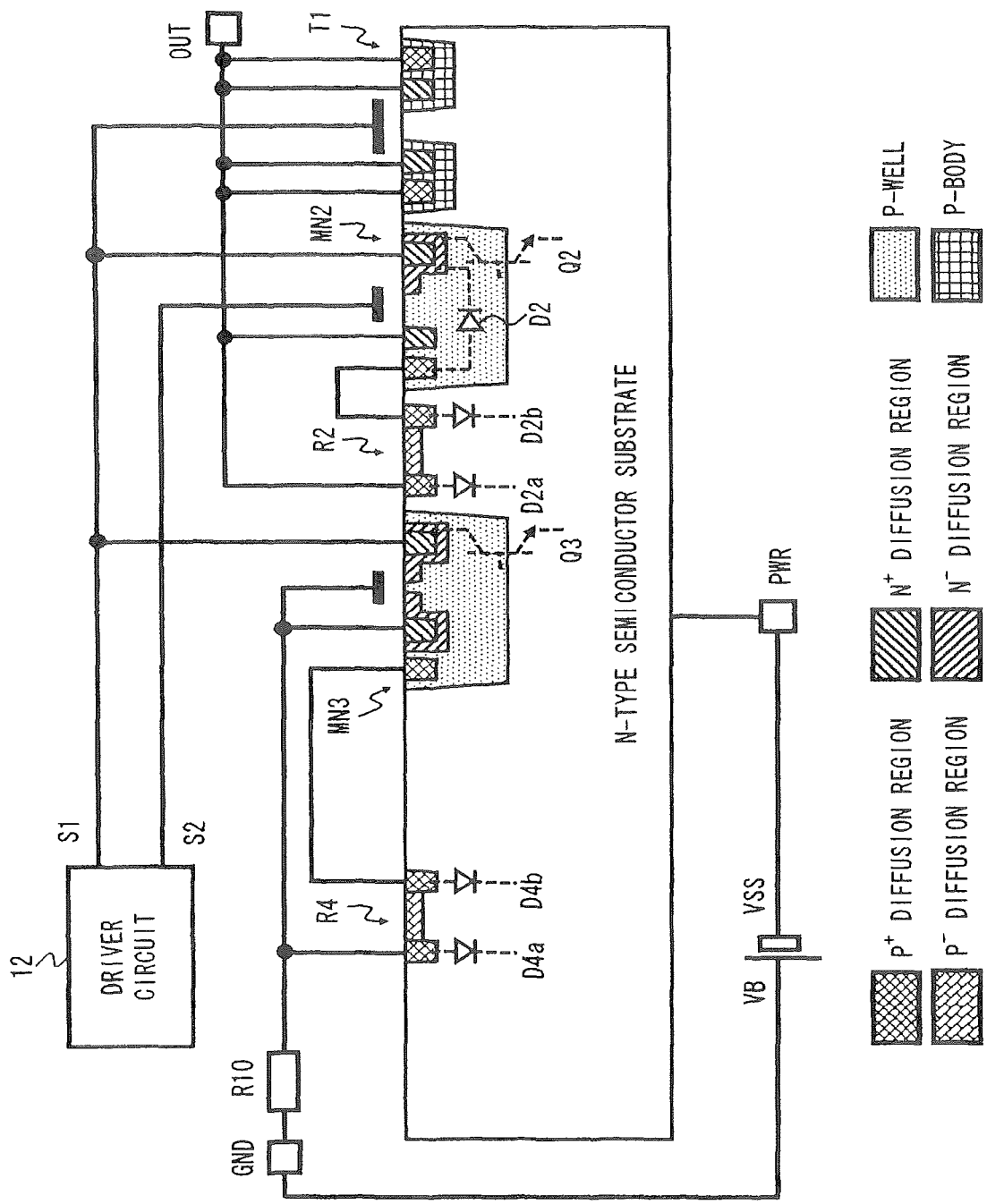
FIG. 12 is a sectional view of the semiconductor device illustrating the parasitic elements formed in the load driving device according to the third exemplary embodiment of the present invention.
Figure 13:
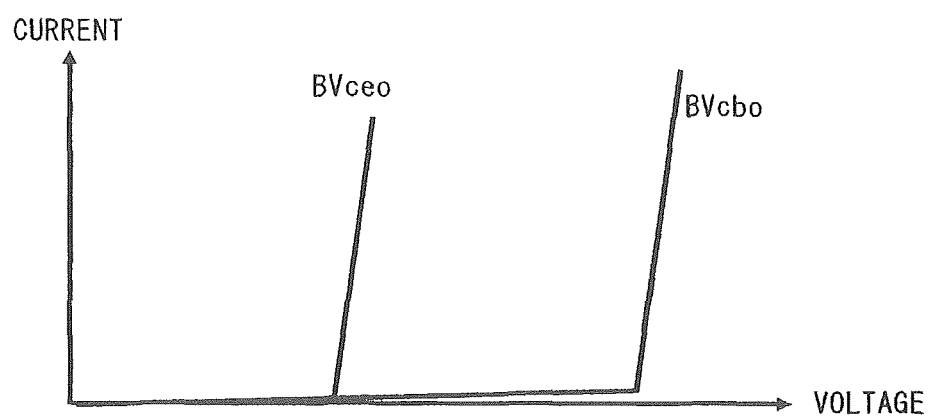
FIG. 13 is a graph showing breakdown voltage characteristics of a bipolar transistor.
Figure 14:
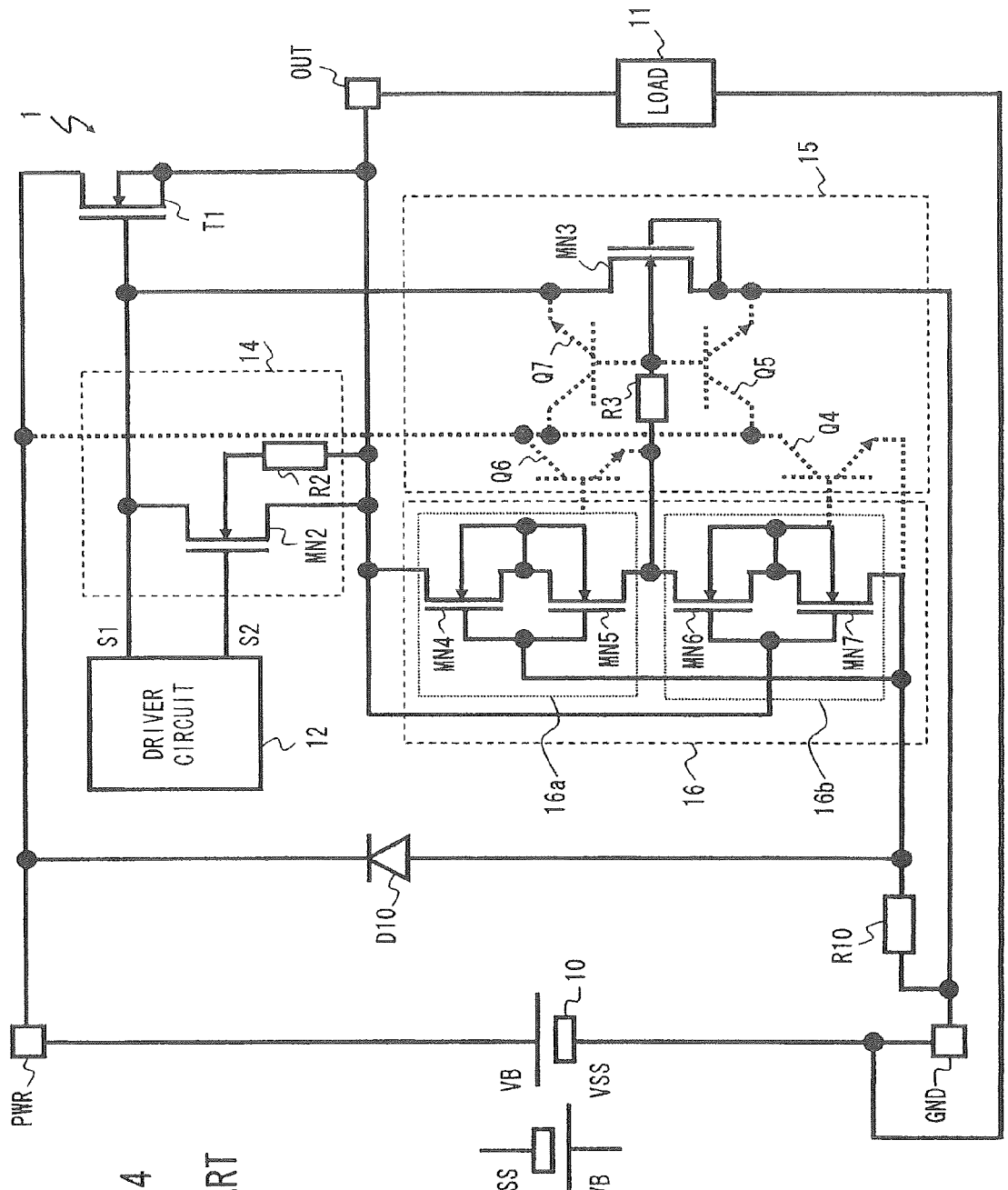
FIG. 14 is a circuit diagram of a load driving device according to a prior art.

FIG. 9 shows a circuit diagram of a load driving device 4 according to a third exemplary embodiment of the present invention. FIG. 10 shows a sectional view of devices constituting the load driving device 4 according to the third exemplary embodiment. FIG. 11 shows a circuit diagram of the load driving device 4 at the time of reverse connection of a power supply. FIG. 12 shows a sectional view of the devices constituting the load driving device 4 at the time of reverse connection of the power supply.

The load driving device 4 is a modified example of the load driving device 2, in which the first N-type MOS transistor MN8 is replaced by a diffusion resistor (a first resistor) R4. The functions of the load driving device 4 can be implemented by a smaller number of constituent elements than the load driving device 2.

A back gate control circuit 17c of the load driving device 4 includes the resistor R4. More specifically, the resistor R4 has one terminal coupled to the anode of the diode D10, and the other terminal coupled to the back gate of the protection transistor MN3. Parasitic diodes D4a and D4b are formed to the resistor R4 as parasitic elements. The other parasitic elements are similar to those shown in FIG. 1, so the description thereof is omitted.

More specifically, the parasitic diode D4a has an anode connected to a terminal of the resistor R4 on the anode side of the diode D10, and a cathode coupled to the power supply terminal PWR. The parasitic diode D4b has an anode connected to a terminal of the resistor R4 on the back gate side of the protection transistor MN3, and a cathode coupled to the power supply terminal PWR.

Next, an operation of the load driving device 4 will be described. In this case, the back gate of the protection transistor MN3 is coupled to the ground terminal GND through the resistor R4 and the resistor R10. Accordingly, when the power supply 10 is normally connected, the protection transistor MN3 exhibits a non-conduction state. Further, the voltage of the ground terminal GND (the negative-polarity-side voltage VSS of the power supply 10) is supplied to the base of the parasitic bipolar transistor Q5 and Q6 through the resistor R4 and the resistor R10. Thus, also in the state where the power supply 10 is at high voltage, the parasitic bipolar transistor Q5 and Q6 exhibits the non-conduction state. Furthermore, the parasitic diodes D4a and D4b exhibit the non-conduction state, since the parasitic diodes D4a and D4b are reversely biased. In short, in the standby state when the power supply 10 is normally connected, no current flows through the parasitic bipolar transistor Q3. Therefore, the load driving device 4 can suppress an increase in consumption current.

When the power supply 10 is reversely connected, a current path from the ground terminal GND to the diode D10 through the resistor R10 is formed. Also, a current path from the ground terminal GND to the parasitic diode D4a through the resistor R10 is formed. In this case, the voltage at the anode of the diode D10 is a forward voltage (e.g., 0.7 V). Similarly, a current path from the ground terminal GND to the parasitic diode D4b through the resistor R10 and the resistor R4 is also formed. In this case, however, the current flowing through the parasitic diode D4b is restricted by the resistor R4. Thus, the amount of current flowing through the parasitic diode D4a is smaller than the amount of current flowing through the parasitic diode D4b. Specifically, the forward voltage (e.g., 0.5 V) of the parasitic diode D4b is smaller than 0.7 V. Accordingly, a low potential is applied to the back gate of the protection transistor MN3. As a result, the protection transistor MN3 becomes conductive. In other words, since the electric charges from the ground terminal GND are supplied to the gate of the output transistor T1 through the protection transistor MN3, the output transistor T1 becomes conductive. Meanwhile, the forward voltage of the parasitic diode D4b is about 0.5 V, so the parasitic bipolar transistor Q3 becomes non-conductive. This prevents the parasitic bipolar transistor Q3 from drawing the electric charges from the gate of the output transistor T1, thereby maintaining the conduction state of the output transistor T1. In this manner, the same effects as those of the first exemplary embodiment can also be obtained in the load driving device 4 according to the third exemplary embodiment.

As described above, the load driving devices according to exemplary embodiments of the present invention bring the output transistor T1 into a conduction state when the power supply 10 is reversely connected, thereby suppressing heat generation in the output transistor and preventing breakdown of the load driving device. Moreover, the load driving devices according to exemplary embodiments of the present invention can maintain the non-conduction state of the parasitic bipolar transistors and suppress an increase in consumption current even when the power driving device operates at the maximum allowable power supply voltage in the standby state when the power supply 10 is normally connected.

The present invention is not limited to the above exemplary embodiments, but can be modified in various manners without departing from the scope of the present invention. While the above exemplary embodiments show an example in which the gate discharge circuit, the reverse connection protection circuit, the back gate control circuit, and the output transistor are formed on a single semiconductor substrate, the present invention is not limited thereto. In other words, the present invention is not limited to the configuration in which the gate discharge circuit, the reverse connection protection circuit, the back gate control circuit, and the output transistor are formed on a single semiconductor substrate.

The first, second, and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A load driving method, comprising:
   bringing an output transistor disposed between a first power supply line and an output terminal connected to a load into a conduction state by a protection transistor provided between a gate of the output transistor and a second power supply line when a polarity of a power supply coupled between the first power supply line and the second power supply lines is reversed; and
   forming a conductive path between the second power supply line and a back gate of the protection transistor via a transistor by a back gate control circuit when the polarity of the power supply is normal,
   the back gate control circuit comprising the transistor, a gate of the transistor being coupled to the first power supply line directly via a connection node located in a connecting line that couples the first power supply line and the output transistor, the transistor being coupled between the second power supply line and the back gate of the protection transistor.

2. The load driving method according to claim 1, wherein, when the polarity of the power supply is reversed, a voltage according to a voltage of the first power supply line is supplied to the back gate of the protection transistor by using the back gate control circuit.

3. The load driving method according to claim 1, wherein the transistor of the back gate control circuit controls conduction/non-conduction between the second power supply line and the back gate of the protection transistor according to a voltage of the first power supply line.

4. The load driving method according to claim 3, wherein the transistor of the back gate control circuit further includes:
   a first terminal and a back gate each coupled to the back gate of the protection transistor, and a second terminal coupled to the second power supply line.

5. The load driving method according to claim 3, wherein conduction/non-conduction between the output terminal and the back gate of the protection transistor is controlled according to a voltage of the second power supply line by using another transistor provided in the back gate control circuit.

6. The load driving method according to claim 5, wherein said another transistor of the back gate control circuit further includes:
a first terminal coupled to the output terminal;
a second terminal and a back gate coupled to the first terminal and the back gate of the transistor of the back gate control circuit; and
a gate coupled to the second power supply line.

7. The load driving method according to claim 1, wherein the conductive path is formed via a first resistor provided between the back gate control circuit and the back gate of the protection transistor.

8. The load driving method according to claim 7, wherein the output transistor, the protection transistor, the first resistor, and the back gate control circuit are formed on an N-type semiconductor substrate.

9. The load driving method according to claim 1, wherein, when the polarity of the power supply is normal, the conductive path is formed between a node between a protection diode and a current restriction resistor and the back gate of the protection transistor via the transistor by the back gate control circuit, a cathode of the protection diode being coupled to the first power supply line, one end of the current restriction resistor being coupled to an anode of the protection diode, and another end of the current restriction resistor being coupled to the second power supply line.

10. The load driving method according to claim 9, wherein the transistor of the back gate control circuit further includes:
a first terminal and a back gate each coupled to the back gate of the protection transistor, and
a second terminal coupled to the node between the protection diode and the current restriction resistor.

11. The load driving method according to claim 1, wherein, when the output transistor is brought into a non-conduction state, a conductive path is formed between the gate and a source of the output transistor by using a discharge transistor provided between the gate and the source of the output transistor.

12. The load driving method according to claim 1, wherein, when the output transistor is brought into a non-conduction state, a conductive path is formed between the gate and a source of the output transistor by using a discharge transistor provided between the gate and the source of the output transistor and a second resistor provided between a back gate of the discharge transistor and the source of the output transistor.

13. A load driving method, comprising:
bringing an output transistor disposed between a first power supply line and an output terminal connected to a load into a conduction state by a protection transistor provided between a gate of the output transistor and a second power supply line when a polarity of a power supply coupled between the first power supply line and the second power supply lines is reversed; and
supplying a voltage at a node between a protection diode and a current restriction resistor to a back gate of the protection transistor via a diffusion resistor when the polarity of the power supply is normal, the voltage at the node indicating a voltage of the second power supply line, a cathode of the protection diode being coupled to the first power supply line directly via a connection node located in a connecting line that couples the first power supply line and the output transistor, one end of the current restriction resistor being coupled to an anode of the protection diode, and another end of the current restriction resistor being coupled to the second power supply line,
wherein the node is directly connected to a terminal of the diffusion resistor and another terminal of the diffusion resistor is connected to the back gate of the protection transistor.

14. The load driving method according to claim 13, wherein the output transistor, the protection transistor, and the diffusion resistor are formed on an N-type semiconductor substrate.

15. The load driving method according to claim 13, wherein, when the output transistor is brought into a non-conduction state, a conductive path is formed between the gate and a source of the output transistor by using a discharge transistor provided between the gate and the source of the output transistor.

16. The load driving method according to claim 13, wherein, when the output transistor is brought into a non-conduction state, a conductive path is formed between the gate and a source of the output transistor by using a discharge transistor provided between the gate and the source of the output transistor and another diffusion resistor provided between a back gate of the discharge transistor and the source of the output transistor.

17. A load driving device, comprising:
an output transistor coupled between a first power supply line and an output terminal, the output terminal being configured to be coupled with a load;
a protection transistor that is provided between a gate of the output transistor and a second power supply line, and brings the output transistor into a conduction state when a polarity of a power supply coupled between the first power supply line and the second power supply line is reversed;
a current restriction resistor and a diffusion resistor series-connected between the second power supply line and a back gate of the protection transistor; and
a protection diode, an anode of the protection diode being coupled to a node between the current restriction resistor and the diffusion resistor, and a cathode of the protection diode being coupled to the first power supply line directly via a connection node located in a connecting line that couples the first power supply line and the output transistor,
wherein the node is directly connected to a terminal of the diffusion resistor and another terminal of the diffusion resistor is connected to the back gate of the protection transistor.

* * * * *